US008994564B2

(12) United States Patent
Hurrell et al.

(10) Patent No.: US 8,994,564 B2
(45) Date of Patent: Mar. 31, 2015

(54) ANALOG TO DIGITAL CONVERTER INCLUDING A PRE-CHARGE CIRCUIT

(71) Applicants: Christopher Peter Hurrell, Berkshire (GB); Derek Hummerstone, Berkshire (GB); Meabh Shine, County Limerick (IE)

(72) Inventors: Christopher Peter Hurrell, Berkshire (GB); Derek Hummerstone, Berkshire (GB); Meabh Shine, County Limerick (IE)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 14/016,787

(22) Filed: Sep. 3, 2013

(65) Prior Publication Data

US 2014/0070976 A1    Mar. 13, 2014

Related U.S. Application Data

(60) Provisional application No. 61/698,252, filed on Sep. 7, 2012.

(51) Int. Cl.
*H03M 1/12*  (2006.01)
*G11C 27/02*  (2006.01)
*H03K 17/687*  (2006.01)

(52) U.S. Cl.
CPC .............. *H03M 1/1245* (2013.01); *H03M 1/12* (2013.01); *H03K 17/687* (2013.01); *G11C 27/02* (2013.01); *H03M 1/1225* (2013.01)
USPC ........................................... 341/122; 327/94

(58) Field of Classification Search
CPC .. H03M 1/124; H03M 1/1245; H03K 17/041; H03K 17/0412; H03K 17/0413; H03K 17/06; H03K 17/063; H03K 17/16; H03K 17/161; H03K 17/164; G11C 27/02; G11C 27/024; G11C 27/026
USPC ................................. 341/122, 155; 327/91, 94
See application file for complete search history.

(56) References Cited

U.S. PATENT DOCUMENTS

| | | | | |
|---|---|---|---|---|
| 5,172,019 | A * | 12/1992 | Naylor et al. | 327/390 |
| 7,564,394 | B1 * | 7/2009 | Li | 341/155 |
| 7,936,187 | B1 * | 5/2011 | Wu et al. | 327/94 |
| 8,723,556 | B2 * | 5/2014 | Thomas | 327/94 |
| 2006/0192546 | A1 * | 8/2006 | Geelen | 324/94 |
| 2008/0180136 | A1 * | 7/2008 | Wu et al. | 327/94 |

OTHER PUBLICATIONS

PCT International Search Report and Written Opinion for PCT/IB2013/002508, mailed on Jun. 25, 2014, 23 pages.
Zwei-Mei Lee et al., "A CMOS 15-bit 125-MS/s Time-Interleaved ADC With Digital Background Calibration", IEEE Journal of Solid-State Circuits, Piscataway, NJ, USA, vol. 42, No. 10, Oct. 2007, XP011193066, pp. 2149-2160.
Greshishchev et al., "A 40GS/s 6b ACD in 65nm CMOS", IEEE Solid-State Circuits Conference, Digest of Technical Papers (ISSCC), Piscataway, NJ, USA, Feb. 7, 2010, XP031650057, pp. 390-391.

(Continued)

*Primary Examiner* — Howard Williams
(74) *Attorney, Agent, or Firm* — Kenyon & Kenyon LLP

(57) ABSTRACT

An analog to digital converter comprising at least one sampling capacitor connected to a sample node, and a pre-charge circuit arranged to cause the voltage on the sample node to substantially match the input voltage prior to the analog to digital converter entering an acquire mode in which the sample node is connected to the input node by a sample switch.

41 Claims, 14 Drawing Sheets

(56) References Cited

OTHER PUBLICATIONS

Gupta et al., "A 1-GS/s 11-bit ADC With 55-dB SNDR, 250-mW Power Realized by a High Bandwidth Scalable Time-Interleaved Architecture", IEEE Journal of Solid-State Circuits, IEEE Service Center, Piscataway, NJ, USA, vol. 41, No. 12, Dec. 2006, XP011150722, pp. 2650-2657.

Traff et al., "Snapshot sampling for ultra-high speed data acquisition", Electronics Letters, vol. 33, No. 13, Jun. 19, 1997, XP006007606, pp. 1137-1139.

Hassan et al., "Design of 8-bit SAR-ADC CMOS", IEEE Student Conference on Research and Development (SCORED 2009), Piscataway, NJ, USA, Nov. 16, 2009, XP031655639, pp. 272-275.

McCreary et al., "All-MOS Charge Redistribution Analog-To-Digital Conversion Techniques—Part I", IEEE Journal of Solid-State Circuits, Piscataway, NJ, USA, vol. SC-10, No. 6, Dec. 1975, XP000916718, pp. 371-379.

\* cited by examiner

| Switch | Acquire | Precharge | Convert |
|---|---|---|---|
| A1 | 1 | 1 | 0 |
| A2 | 0 | 0 | 1 |
| A3 | 1 | 0 | 0 |
| A4 | 0 | 1 | 1 |
| A5 | 0 | 0 | 0 |
| A6 | 0 | 0 | 1 |
| A7 | 1 | 0 | 0 |
| A8 | 0 | 0 | 0 |
| A9 | 0 | 1 | 0 |

FIG. 6

| Switch | Convert | Precharge 1 | Precharge 2 | Acquire |
|---|---|---|---|---|
| A1 | 0 | 0 | 1 | 1 |
| A2 | 1 | 1 | 0 | 0 |
| A3 | 0 | 0 | 0 | 1 |
| A4 | 1 | 1 | 0 | 0 |
| A5 | 0 | 0 | 1 | 0 |
| A6 | 1 | 1 | 0 | 0 |
| A7 | 0 | 0 | 1 | 1 |
| A8 | 0 | 1 | 0 | 0 |
| A9 | 0 | 0 | 0 | 0 |

ANALOG TO DIGITAL CONVERTER INCLUDING A PRE-CHARGE CIRCUIT

FIELD

The present application relates to an analog to digital converter including a pre-charge circuit for modifying charge on a sampling network.

BACKGROUND

Analog to digital converters (ADCs) operated in a sample and convert cycle update the voltage stored on their sampling capacitor between successive conversions. The throughput of the converter may, in part, be limited by the time taken to change the voltage stored on the sampling capacitor at the end of an Nth conversion to that appropriate for a N+1th conversion.

SUMMARY

According to a first aspect there is provided an analog to digital converter comprising at least one sampling capacitor connectable to an input node, and a precharge circuit arranged to cause a voltage at a node of the at least one sampling capacitor to substantially match an input voltage of the input node prior to the analog to digital converter entering an acquire mode in which the at least one sampling capacitor is connected to the input node by a first sampling switch.

The precharge circuit may be intermittently powered. The precharge circuit may comprise an active device such as an amplifier or a voltage follower. The precharge circuit may be connected to a voltage translation device, such as a capacitor.

The input voltage may be present value of the voltage at the input node or it may be a value that was sampled and stored from an earlier time.

In an embodiment there is provided an analog to digital converter comprising at least one sampling capacitor connected to a sample node, and a pre-charge circuit arranged to monitor an input voltage at an input node and to cause the voltage at the sample node to substantially match the input voltage prior to the analog to digital converter entering an acquire mode in which the sample node is connected to the input node by a first sample switch, and wherein the pre-charge circuit is intermittently powered.

It is thus possible to speed up the throughput of an analog to digital converter by reducing disturbance of the network driving the ADC induced by the ADC acquire operation and so reduce the acquisition time required to settle out this disturbance.

The use of a pre-charge circuit reduces, and preferably substantially minimizes, exchanges of charge between an input to the analog to digital converter and the or each sample node of the analog to digital converter during an acquire operation. Some ADC designs may include multiple sampling capacitors each of which can be regarded as being connected to a respective sample node.

Preferably the pre-charge circuit comprises an operational amplifier or a differential amplifier. The operational amplifier may be arranged as a voltage follower having an input connected to the input node of the analog to digital converter. Alternatively the operational amplifier may have a first input arranged to monitor the voltage at an input node and a second input arranged to monitor a voltage stored on the sampling capacitor or at the at least one sample node, and an output connected in such a way as to charge the sampling capacitor or sample node so as to reduce a difference between the input voltages at the first and second inputs.

The first input of the amplifier may be directly connected to the input node, may be connected via a transistor acting as a switch or a variable impedance (such as a voltage controlled resistor so as to provide a soft switching action and/or noise bandwidth control), and/or may be connected via a voltage level shifting component such as a capacitor. The second input of the amplifier may be connected to the at least one sampling capacitor or the sample node by an arrangement similar to or identical to that used in association with the first input of the amplifier.

The output of the amplifier may be connectable to the at least one sampling capacitor by a pre-charge circuit output switch. Thus, when the switch is in a low impedance state (closed) the amplifier output can be regarded as being directly connected to the at least one sampling capacitor. Alternatively the amplifier output stage may be modified to have an optional high impedance state. This may be achieved by de-powering the output stage.

Advantageously the amplifier may provide an output spanning the entirety of an input range of the analog to digital converter. However, in order to minimize power consumption by the pre-charge circuit it may be desirable for the amplifier therein to operate from a reduced voltage power supply compared to the input range of the analog to digital converter. In such a situation the output from the amplifier may be selectively connected to a first plate of a capacitor used to perform voltage translation, and for convenience such a capacitor will be referred to as a voltage translation capacitor. The second plate of the voltage translation capacitor may also be selectively connectable to the sample node. A charge circuit may also be provided to charge the voltage translation capacitor such that a voltage difference exists across the voltage translation capacitor. Such an arrangement enables the output voltage of the amplifier to be level shifted by a voltage corresponding to the voltage difference across the voltage translation capacitor. A plurality of such capacitors, in association with a suitable switching circuit to connect them may be provided.

The at least one sampling capacitor may be a dedicated sampling capacitor. In such an arrangement the sampling capacitor is distinct from a digital to analog converter that may be provided within the analog to digital converter.

In some embodiments the analog to digital converter includes a switched capacitor array which functions as a digital to analog converter. Such a switched capacitor array, which may also be referred to as a capacitor DAC, can also be used (either in its entirety or only partly) to sample the input signal. Thus a plurality of capacitors within the capacitor DAC can act as a plurality of sampling capacitors.

The capacitor DAC may be segmented in order to reduce the scaling required between a capacitor (or capacitors in a thermometrically encoded DAC) representing several of the most significant bits (MSB) and the capacitor or capacitors representing several of the least significant bits (LSB). The capacitor DAC may be associated with additional components within the analog to digital converter, such as a flash converter or a further successive approximation converter formed using a small (mini) capacitive or other DAC, in order to convert a number, for example an integer "A", of the most significant bits of the output result from the ADC before progressing to convert the remaining bits using the capacitive DAC in a successive approximation conversion.

The analog to digital converter is not restricted to being a successive approximation converter using a capacitive DAC. Other converter technologies, such as delta-sigma converters and pipeline converters operated in a sample and hold style may also benefit from use of pre-charge circuit associated with a sampling capacitor of the analog to digital converter.

The pre-charge circuit need only be powered during a pre-charge phase or phases when it is modifying the charge at the sample node or at the back gate of a transistor switch. Thus the pre-charge circuit can be powered down when not required. Similarly the analog to digital converter may be substantially or completely powered down between completing one conversion and commencing a subsequent conversion. This enables the combination of the ADC and the pre-charge circuit to have a power consumption that scales substantially linearly with the conversion rate. Powering up and powering down of the pre-charge circuit may be controlled by a state machine that is synchronized with or that controls the conversion operation performed by the ADC.

According to a second aspect there is provided a method of operating an analog to digital converter which, in use, has an input node connected to an output of a circuit to supply a signal for conversion, and wherein an acquire operation of the analog to digital converter comprises:
  a) a first acquire phase in which a pre-charge circuit is used to transfer charge to or from a sample node of the analog to digital converter so as to cause a voltage at the sample node to approximate the voltage at the input node of the analog to digital converter;
  b) a second acquire phase in which the pre-charge circuit is disconnected from the sample node;
  c) a third acquire phase in which the sample node is connected to the input node by way of a switch so as to acquire the input voltage on a sampling capacitor; and
  d) a fourth acquire phase in which the sampling capacitor is disconnected from the input node so as to hold a voltage on the sampling capacitor; and
  where the pre-charge circuit is intermittently powered.

The input node voltage may be the voltage presently at the input node or may be a voltage captured at an earlier time.

A first terminal of the sampling capacitor (or capacitor array) may be connected to the sampling node during the first acquire phase by way of a first sample switch or switches and a second terminal of the sampling capacitor may be connected by way of a second switch (or in the case of a capacitor array by respective switches) to a second voltage which may be a bias voltage, a supply or ground voltage, or which is supplied by a second input node or is floating. If the sampling capacitor is floating, then the precharge circuit acts to pre-charge parasitic capacitors associated with transistor switches of the ADC.

During the third acquire phase the second terminal of the sampling capacitor may also be connected to the second voltage.

According to a further aspect there is provided a switch arrangement for connecting a first node to a second node, comprising a first field effect transistor connected between the first node and the second node, and a second field effect transistor having a drain and source connected to the first node, and wherein control signals applied to gates of the first and second transistors are driven in anti-phase.

BRIEF DESCRIPTION OF THE FIGURES

Some embodiments will now be described, by way of non-limiting example only, with reference to the accompanying drawings in which:

FIG. 6 is a table showing the switch states for the circuit of FIG. 5 when moving from an acquire mode to a convert mode;

FIG. 7 is a table showing the switch states for the circuit of FIG. 5 when moving from the convert mode to the acquire mode;

DESCRIPTION OF EXAMPLE EMBODIMENTS

Figure 1:
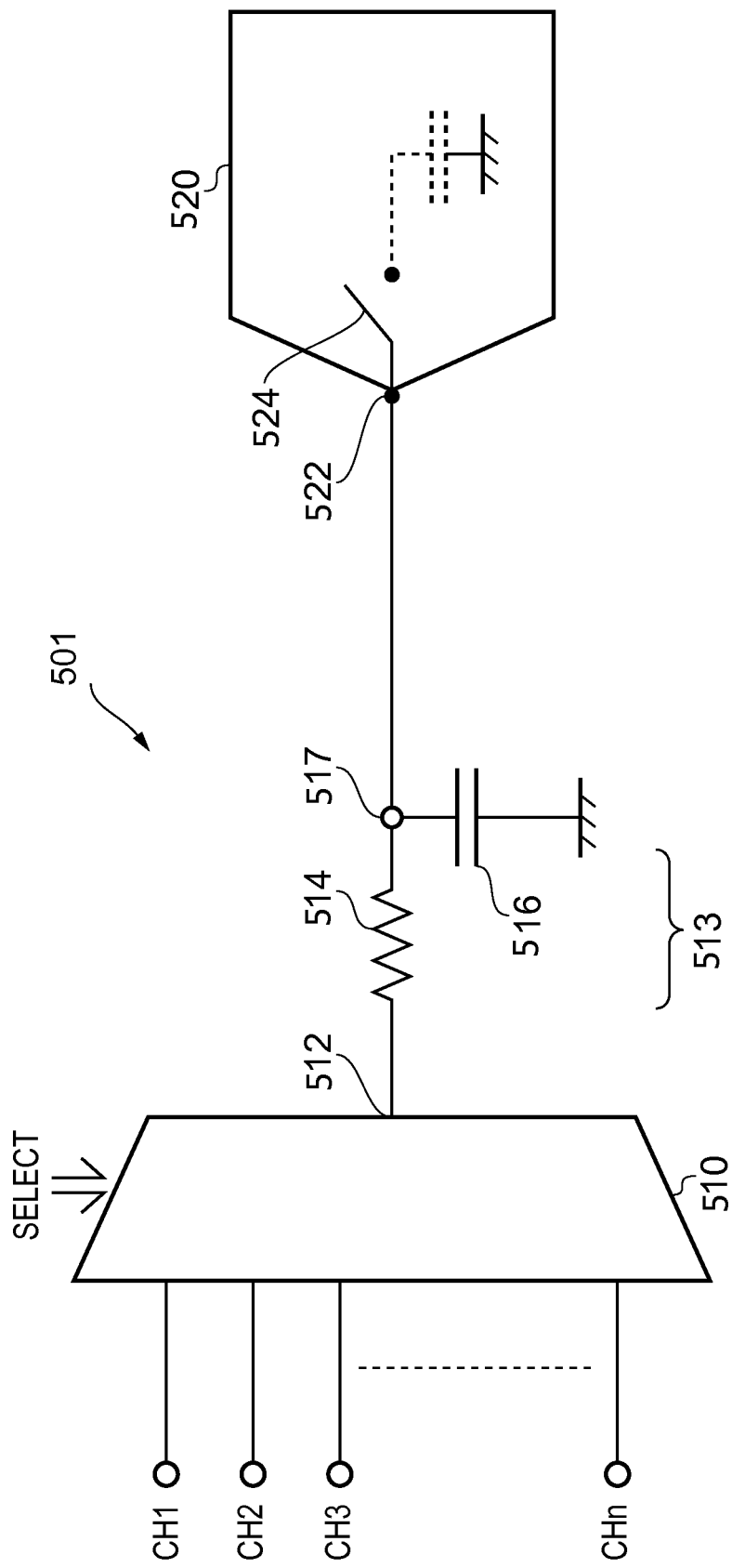
FIG. 1 illustrates a prior art multi-channel ADC in which a multiplexer selects between several channels to select a channel for conversion.

A multi-channel ADC 501 is illustrated in FIG. 1. All or some of the components may be provided on a single integrated circuit. The multi-channel ADC 501 comprises a multiplexer 510 having 'n' inputs labeled CH1 to CHn. In response to a selection control signal, SELECT, in the form of a multibit word, the multiplexer can select any one of its inputs for connection to an output 512 of the multiplexer 510. The output 512 of the multiplexer 510 is, in this prior art multi-channel ADC, connected, i.e. permanently connected, to an input 522 of an analog to digital converter 520. The connection may include an intermediate RC low pass filter 513 having a filter output node 517. The filter 513 may be formed by a resistor 514 in series between the output 512 of the multiplexer 510 and the filter output node 517, and a capacitor 516 provided between the node 517 and an AC ground or a low impedance. The combination of resistor 514 having a resistance R and the capacitor 516 having a capacitance C forms a filter having a pole $$f_o = \frac{1}{2\pi RC},$$

which serves to limit the noise power sampled by the analog to digital converter 520. It should be noted that other filter configurations may be used, as known to the person skilled in the art.

Whilst this arrangement reduces the noise power in the signal at the input 522 of the ADC 520, it can also become a source of error in the ADC. To illustrate why, consider the operation of the multi-channel ADC 501 where it converts CH1 and CH2 in sequence. The voltages of CH1 and CH2 may be dissimilar. Let us assume that CH1 had a high signal value on it, and that CH2 has a low signal value, close to a few LSB in value.

If the ADC 520 comprises a switched capacitor DAC array that also acts as a sampling capacitor then as the conversion for CH1 nears its completion, the effective voltage on the switched capacitor DAC is substantially that of CH1 at the time that CH1 was sampled prior to starting the analog to digital conversion.

Once the conversion is complete, the capacitors of the capacitive array reconnect to the input 522 of the ADC 520 to become charged to the next value that is to be converted.

If the multi-channel ADC 501 is being operated quite quickly, it is reasonable to assume that CH2 had been selected whilst the ADC 520 was performing its conversion. Hence the capacitor 516 has become charged to the voltage of CH2. However when the capacitor array or sampling capacitor of the ADC 520 becomes reconnected to the capacitor 516 (and CH2 via the multiplexer) by first sample switch or switches 524 within ADC 520, further charge redistribution between the ADC 520 and the capacitor 516 occurs. This results in the voltage on capacitor 516 and at the input 522 of the ADC 520 differing from the voltage on the CH2 input to the multiplexer 510. Charge must therefore flow through resistor 514 to charge capacitor 516 to a value close to the value on the CH2 input to the multiplexer 510 before an accurate voltage measurement by ADC 520 can be made.

Thus the acquire time for the multi-channel ADC 501 is longer than might otherwise be expected.

Arrangements disclosed herein seek to reduce the acquire time required to achieve a particular accuracy by providing a pre-charge circuit that provides most, if not all, of the additional charge that results from charging the voltage of the sampling capacitor of a multi-channel ADC from that suitable for a preceding conversion, e.g. a N−1th conversion, to that of a current or succeeding conversion, e.g. a Nth conversion.

Figure 2:
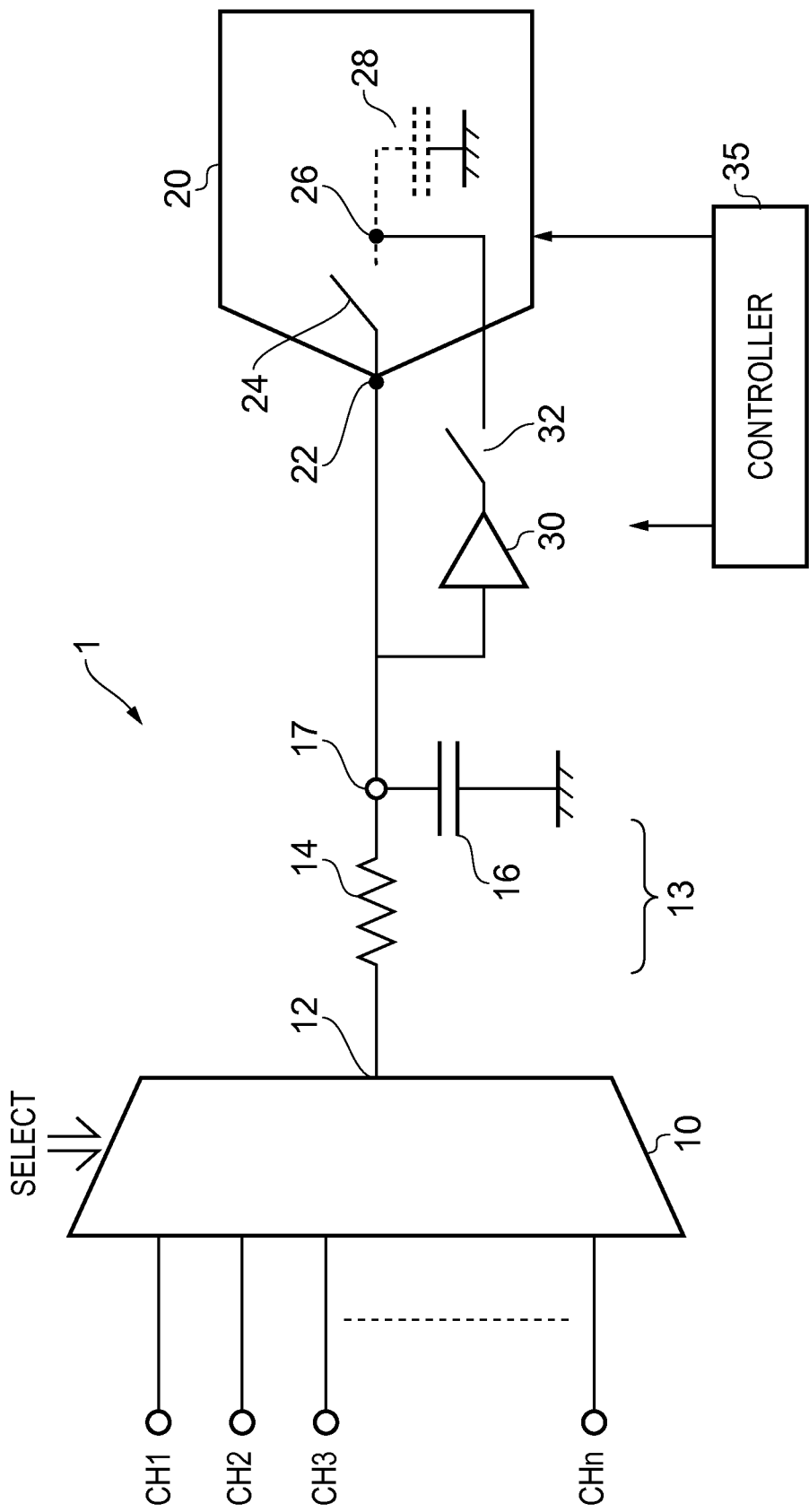
FIG. 2 illustrates a multi-channel ADC constituting a first embodiment.

One way of doing this, as shown in a multi-channel ADC 1 in FIG. 2 is to add a pre-charge circuit 30, such as a voltage follower, that tracks the output voltage at the output of the filter 13, and which can be switched to a sample node 26 of the ADC 20 in place of the output voltage from the RC filter 13 formed by resistor 14 and capacitor 16, during a first part of the acquisition phase. This enables charge to be moved to or from the ADC 20 sampling capacitor without perturbing the voltage on capacitor 16. The sample node 26 is between the first ADC sample switch 24 and a sampling capacitor 28 of the ADC 20. In some ADC converter implementations there can be a plurality of sampling capacitors, and each is associated with a respective first sample switch.

A pre-charge circuit output switch 32 may be provided at the output of the pre-charge circuit 30 for selectively connecting or disconnecting the pre-charge circuit from the sample node 26 of the ADC 20. A controller 35, such as a state machine, is provided to control the operation of the ADC 20 and the pre-charge circuit 30 and any associated switches. The switch 32 may be omitted if the output stage of the precharge circuit can be placed in a high impedance state, Although the pre-charge circuit has been shown as being an amplifier acting as a voltage follower and connected to the output of the RC filter, the amplifier may be connected to the output 12 of the multiplexer, and may be arranged to have a filter response in its frequency characteristic which is at a frequency $f_o$ or other appropriate frequency. Thus the bandwidth of the precharge circuit may be selected to control the amount of noise power sampled onto the sampling capacitor 28. In some embodiments the precharge circuit may have a variable bandwidth to allow an initial rapid precharge phase, to be followed by a slower phase associated with reduced noise.

Figure 3:
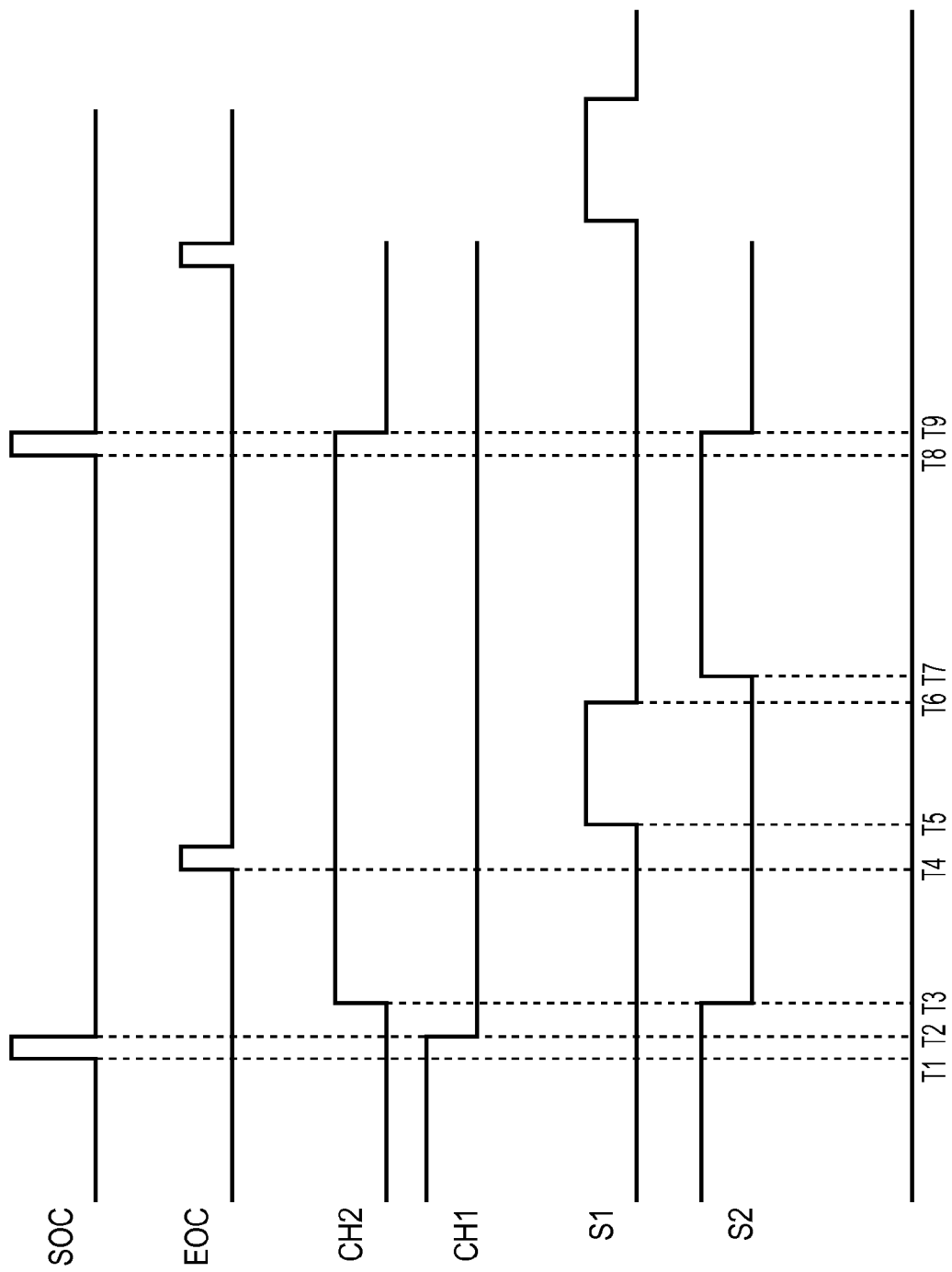
FIG. 3 is a timing diagram showing the inter-relationship between various control signals for the multi-channel ADC of FIG. 2.

FIG. 3 is a timing diagram for the multi-channel ADC 1 shown in FIG. 2. The analog to digital converter 20 starts its conversion process, such as a successive approximation conversion, in response to a start of conversion or "SOC" signal supplied on a control line to it. The analog to digital converter 20 then executes its successive approximation conversion and once it is finished it asserts an end of conversion signal, EOC. We may assume, for simplicity, that this timing diagram relates to the situation which has already been discussed where channel 1 and channel 2 are going to be converted in sequence.

The timing diagram starts at the commencement of the start of convert signal for channel 1, with multiplexer 10 having previously been arranged to select channel 1 and provide it to the multiplexer output 12 and with signal S2 which controls the sample switch 24 asserted so as to place the first sample switch 24 in a low impedance state. At time T=1 the start of convert signal is asserted, and it remains asserted for a short period of time which ends at T2. At this time the signal from the multiplexer is assumed to have been acquired within the analog to digital converter 20. At time T3, the switch signal S2 controlling the switch 24 is de-asserted so as to place the switch 24 in a high impedance state. Also at time T3 (or shortly thereafter) the multiplexer is operated to select channel 2 such that the voltage from channel 2 is now used to charge the capacitor 16 to that at the multiplexer input for channel 2. The analog to digital converter 20 performs the conversion, such as a successive approximation routine (SAR) conversion and at time T4 briefly asserts the end of conversion, EOC, signal. Shortly after the EOC signal has been de-asserted the pre-charge circuit output switch 32 is placed in a low impedance state at time T5 by virtue of switching signal S1 being asserted and the pre-charge circuit can start to modify the charge on the or each sampling capacitor 28 connected to the or each sampling node 26. Signal S1 is held in an asserted value until time T6 and is then de-asserted to place the pre-charge circuit output switch 32 in the high impedance state. Shortly afterwards, at time T7, the switch 24 is placed in a low impedance state in order that a final transfer of charge between the or each sampling capacitor 28 within the analog to digital converter 20 and the capacitor 16 of the RC filter 13 can occur before the next start of conversion is signaled at T8, which effectively corresponds to T1 by marking the commencement of a further conversion cycle.

The pre-charge circuit may remain powered up throughout an entire sample and convert cycle. Alternatively for reduced power consumption the pre-charge circuit may be powered down when it is not in use, and may be powered up on, for example, on instruction from the ADC as it nears the end of a conversion so as to have the pre-charge circuit operational before T5.

It should be noted that the precharge circuit can also be used with, and provide improved performance in, a single channel ADC. Furthermore because some ADC technologies may use error correction sometimes the voltage on the sampling capacitor at the end of a conversion is not equal to the sampled value and in these circumstances it may be beneficial to use the precharge circuit to restore the voltage on the sampling capacitor to its previously sampled value.

Figure 4:
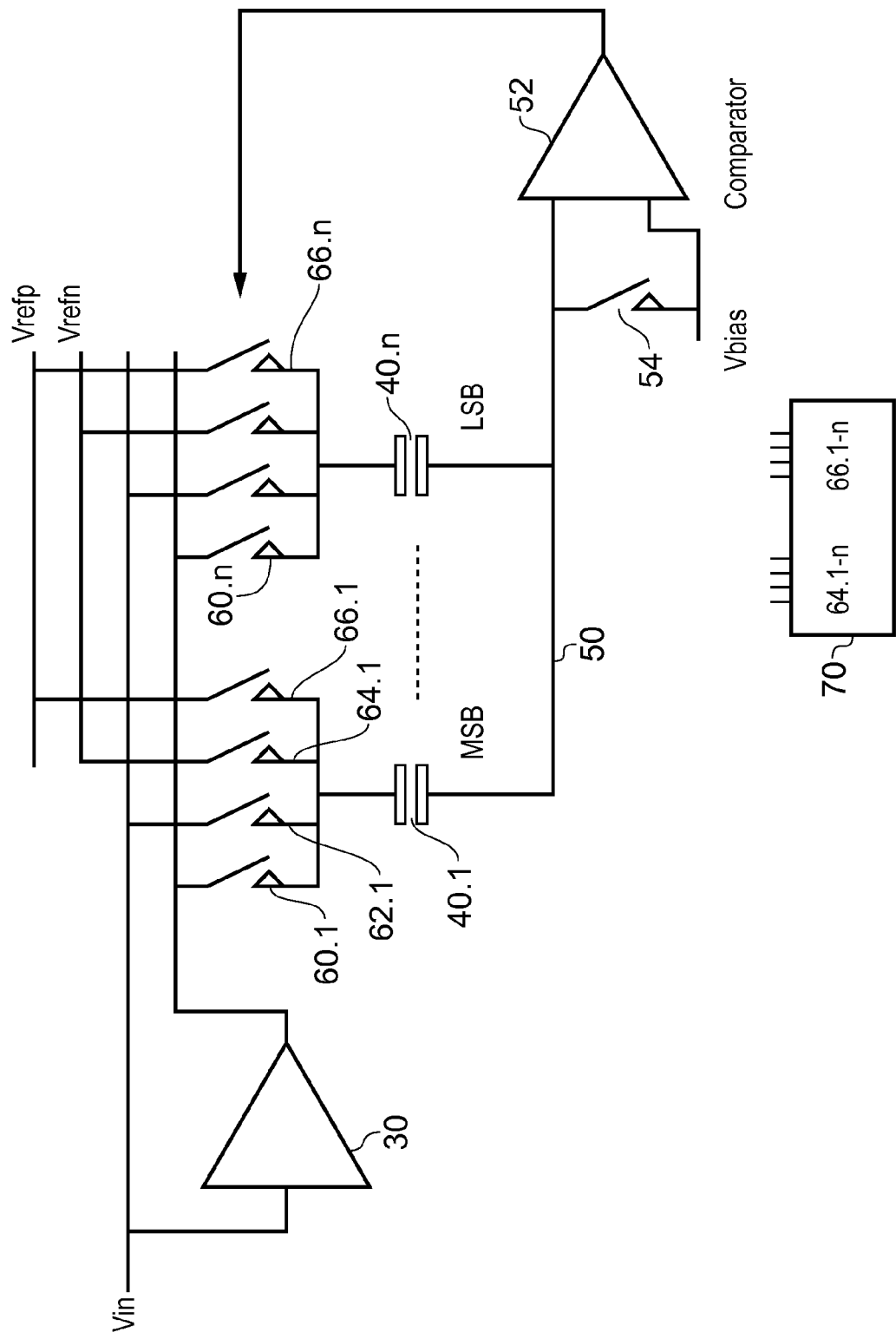
FIG. 4 is a circuit diagram showing components within a second embodiment of an ADC.

FIG. 4 shows the internal architecture of a switched capacitor successive approximation analog to digital converter and its connections to the pre-charge circuit 30 in greater detail. This arrangement may be used to instantiate the ADC shown in FIG. 2. In the arrangement shown in FIG. 4 the precharge circuit output switch 32 has been replicated within the switched capacitor array of the analog to digital converter 20 on a capacitor by capacitor basis. In the arrangement shown in FIG. 4 a plurality of capacitors 40.1 to 40.*n* are provided. Only two of these have been shown, 40.1 and 40.*n*, for diagrammatic simplicity. The capacitors are scaled, in a known manner, in order to fabricate a switched capacitor digital to analog converter. Thus, if the least significant bit of the digital to analog converter is represented by capacitor 40.*n*, then the value of the next smallest bit 40.(n−1) would typically be twice that of the capacitor 40.*n* and so on up to the most significant bit which is associated with capacitor 40.1. Such binary weighting is common, but other weightings such as radix 1.8 are known. Similarly capacitor values may occasionally be repeated within the array in order to provide redundancy such that the analog to digital converter can recover from an incorrect critical bit decision during its conversion process. Furthermore, some of the capacitors, such as the most significant ones, may be provided by pluralities of capacitors which can be selected in a randomized or pseudo-randomized way in order to improve dynamic non-linearity. Thus, the most significant bit, the next most significant bit and the third most significant bit might be formed as selection from an array of, say, seven capacitors having the same size. The most significant bit may be selected by using any four of the seven, the next most significant bit by using any two of the seven, and the third most significant bit by using any one of the seven. The combinations of these may be randomized in order to improve the dynamic non-linearity of the analog to digital converter including such a switched capacitor digital to analog converter.

Returning to FIG. 4, the capacitor of the most significant bit, 40.1 has a bottom plate (as shown in the diagram) connected to a common node 50 which is connected to a first input of a comparator 52. A further (i.e. second) sampling switch 54 is provided in order to connect the node 50 to a voltage supply Vbias during sampling of an input signal of the capacitors of the array. The MSB capacitor 40.1 has, as shown, its upper plate, connected to four switches 60.1, 62.1, 64.1 and 66.1 which are implemented by transistors. The first switch 60.1 is connected to an output of the pre-charge circuit 30. The second switch 62.1 connects directly to the input of the analog to digital converter, i.e. bypassing the pre-charge circuit 30 and is equivalent to the switch 24 of FIG. 2. The third switch 64.1 connects the upper plate of the capacitor 40.1 to a first reference voltage, VrefN and the fourth switch 66.1 connects the upper plate of the most significant bit capacitor 40.1 to a second (positive) reference voltage VrefP. Similar switch arrangements may be provided for each of the capacitors from the most significant bit to the least significant bit 40.*n*. In some embodiments the capacitor array may be segmented, as is known to the person skilled in the art, in order to reduce the scaling requirements between the least significant bit and the most significant bit. Similarly, not all of the capacitors need be involved in sampling the input signal.

The operation of the circuit shown in FIG. 4 is similar to that of the circuit shown in FIG. 2. Thus switches 60.1 to 60.*n* and 62.1 to 62.*n* are open (high impedance) during a SAR bit trial sequence whilst switches 64.1 to 64.*n* and 66.1 to 66.*n* are operated under the control of a SAR controller 70. The precharge circuit 30 may be de-powered during the SAR conversion until the converter 70 asserts a power up signal as it reaches the last few bits of the SAR conversion, thereby giving sufficient time for the precharge circuit 30 to stabilize its output voltage. Then the switches 60.1 to 60.*n* are closed for a predetermined period such that any charge flow required to bring the voltage on the capacitors 40.1 to 40.1 close to a precharge value occurs via the precharge circuit 30. The precharge value may be current value of Vin, or it may be a different value such as a preceding value of Vin, as captured for example during the most immediately preceding acquisition. Vin need not be a DC signal but this makes little difference to the concept that the charge flow occurs via the amplifier of the precharge circuit 30 during this first acquire phase. Then switches 60.1 to 60.*n* are opened, and switches 62.1 to 62.*n* are closed. Preferably (but not necessarily) this is performed in a "break before make" manner. Thus the capacitor array is now connected directly to the output 17 of the filter 13 until such time as a start of convert signal is asserted. The start of convert signal causes the switches 62.1 to 62.*n* to be closed, and the SAR routine is initiated again.

It should be noted that while it would be normally expected that during the pre-charge phase switch 54 would be closed, allowing the voltage across the capacitor to be charged to the difference between Vin and Vbias, this is not absolutely necessary in some cases. There may be non linear (parasitic) capacitors associated with the switches 60, 62, 64 and 66 which can be a significant source of error, particularly in single channel applications. It can therefore be sufficient to charge just the sample node 26 (FIG. 2) of the capacitors (the node connected to the switches 60, 62, 64 and 66) and/or charge the back gate of at least the sampling switches 62.1 to 62.*n* and leave switch 54 open. This reduces the loading on amplifier or precharge circuit 30 allowing a more power efficient arrangement.

The improvement in settling and acquisition times that use of the pre-charge circuit brings may be further improved by appropriate design of the switches associated with the ADC 20 and the pre-charge circuit.

Figure 5:
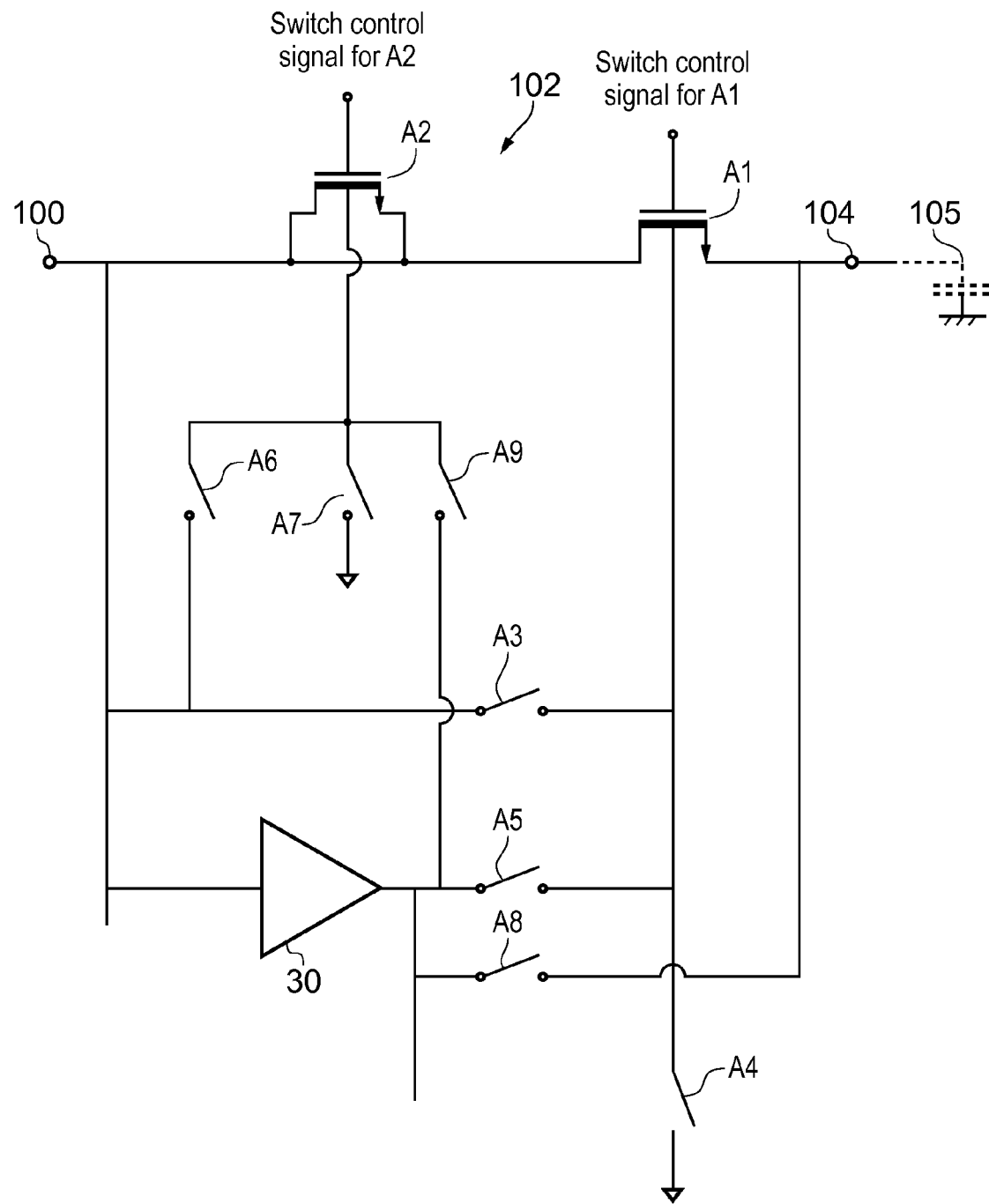
FIG. 5 is a circuit diagram of a switch configuration having reduced charge injection.

FIG. 5 is a circuit diagram of a modified switch arrangement for reducing charge injection errors during the transitions both from convert to acquire and from acquire to convert. This arrangement may be used with the circuits described hereinbefore. The improved switching circuit has an input node, designated 100 which receives the signal from the RC filter 13 shown in FIG. 1. A sample node 104 of the improved switching arrangement 102 is connected to the sampling capacitor 105 of the analog to digital converter. A first acquisition switch A1 is provided in series between the input node 100 and the sample node 104. This switch has the same functionality as switch 24 in FIG. 2. The first acquisition switch A1 is formed by a field effect transistor with a switched connection to its back gate. It is known to the person skilled in the art that an NMOS acquisition switch A1 is formed in a P-type well within an N-type substrate. Driving the back gate of the device (the P-type well) during acquisition with the input provides improved linearity. The gate terminal of A1 is driven with a digital switch control signal to switch it on and off as normal. A second acquire switch A2 is also connected to the input node 100. The second acquire switch has its drain and source connected to the input node 100. The dimensions of the second acquire switch A2 are the same as those of the first acquire switch A1 in order that both switches exhibit the same charge injection characteristic when switching from one state to another.

A third acquire switch A3 is connected between the input node 100 and the back gate of the first acquire switch A1. Alternatively switch A3 can be positioned so as to connect the back gate of A1 to the sample node. A fourth acquire switch A4 is connected between the back gate of the first acquire switch A1 and ground. A fifth acquire switch A5 is connected between the output of buffer 30 and the back gate of the first acquire switch A1. A similar configuration is provided in respect of the second acquire switch A2. A sixth acquire switch A6 is connected between the input node 100 and the back gate of the second acquire switch A2. A seventh acquire switch A7 is connected between the back gate of the second acquire switch A2 and ground. An eighth acquire switch A8 is connected between the output of the buffer 30 and the sample node 104 and finally a ninth acquire switch A9 is connected between buffer 30 output and the back gate of switch A2. The gates of the switches A1 to A9 are driven by logic signals to control the switches.

The switches can be operated to reduce switching errors resulting from charge injection between transitions from acquire to convert and from convert to acquire. The transition from acquire to convert will now be described with reference to FIG. 6. Switch A1 is initially conducting or low impedance, as indicated by the number "1" in the acquire column. During a pre-charge phase A1 is maintained in conducting state and then is switched into a high impedance state, as indicated by a "0", by switching the gate voltage to a lower voltage, for the convert mode. Both switch A2 top and back gates are driven in anti-phase with switch A1 such that any charge injection from switch A1 is cancelled by a corresponding charge depletion by acquisition switch A2. Thus during the pre-charge phase switch A9 is placed in a conducting state, driving switch A2 back gate from ground to the output of amplifier 30 (buffering the voltage on node 100) while A3 is placed in a high impedance state and A4 in a conducting state driving the back gate of A1 in the opposite direction, from the voltage at the output of amplifier 30 to ground. Switching the back gates of both acquisition switches A1 and A2 during the pre-charge phase with switch A1 in a low impedance state allows any voltages so induced across switch A1 to dissipate.

When the switch A1 is switched to a high impedance state, most of the charge from its channel will flow out of the drain of the transistor forming the switch. This is because the further (second) sampling switch (item 54 of FIG. 4) will have already been placed in a high impedance state, so the source of A1 is effectively looking at an open circuit. The charge from the channel is substantially cancelled by a gate charge flowing into A2. This ensures that charge flows from the operation of the switching network are small, and do not perturb the voltage stored on the capacitor 16 or at the sample node.

The back gate of acquisition switch A2 may remain connected to buffer 30 throughout the conversion but to allow buffer 30 to be powered down switch A9 can be put in a high impedance state for the convert phase. The back gate of switch A2 can be then left floating (as shown) or connected to the input node 100 by placing switch A6 in a conducting state.

Acquisition switch A3 is on during the acquire phase such that the back gate of the first acquisition switch A1 is connected to the input node 100, but it is switched to a high impedance state during the pre-charge and convert phases. As might be expected, acquisition switch A4 is driven in anti-phase with acquisition switch A3 so it is in a high impedance state during the acquire phase but is made conducting during the pre-charge and convert phases. The switches are phased such that A3 and A4 are never simultaneously conducting. Acquisition switch A5 is held in a high impedance state during the transition from acquire to convert. Acquisition switch A8 is high impedance during this phase of operation. Acquisition switch A7 is conducting during the acquire phase, but high impedance during precharge and convert.

As noted before, the capacitive DAC within the analog to digital converter 20 will have an effective voltage on it at the end of the conversion which approximates the voltage which was sampled onto the DAC for that conversion. However, in the context of an analog to digital converter where the input frequency may be changing relatively rapidly (i.e. 10% or more of the nyquist frequency for the converter) or where the input is multiplexed between multiple channels then the sample voltage may change substantially from one sample to the next.

FIG. 7 is a table, similar to that shown in FIG. 6, but indicating the switch states during the transition from convert to acquire. Here two pre-charge modes exist between the convert mode and the acquire mode. As might be expected from FIG. 5, the first acquisition switch A1 is in a high impedance state (off) during the convert mode and remains in a high impedance state during the first pre-charge mode before being switched into a low impedance state for the second pre-charge and acquire mode. Acquisition switch A2 is driven in anti-phase with acquisition switch A1 so is in a low impedance state (on) during the convert mode, remains in a low impedance state during the first pre-charge mode, and is in a high impedance state in the second pre-charge and acquire modes with its switching transitions being ideally substantially aligned with those of the first acquisition switch A1. Thus as mentioned before any charge injection resulting from switching acquisition switch A1 top and back gates between states is substantially cancelled by the second acquisition switch undergoing a corresponding but opposing switching transition. The third acquisition switch A3 is held in a high impedance state during the convert and pre-charge modes, but switches to a low impedance state for the acquire mode. Acquisition switch A4 is on during the convert and first pre-charge mode, is off during the second pre-charge mode and remains off during the acquire mode.

Acquisition switch A5 is in a high impedance state during the convert and first pre-charge mode and is switched on during the second pre-charge mode before being switched off during the acquire mode. Acquisition switch A6 is on during both the convert and first pre-charge modes and is switched off during the second pre-charge and acquire modes while switch A7 is off during the convert and first pre-charge modes but is switched on during the second pre-charge and acquire modes. The on state of switches A5 and A7 during the second pre-charge mode drives the back gates of switches A1 and A2 in opposite directions so cancelling charge injection from their back gate connections. Acquire switch A8 is off during the convert phase, is switched on during the first pre-charge mode and then off for the second pre-charge and acquire modes. Charge flow during the first pre-charge mode to charge the sample node 104 and hence the connected sampling capacitor to the new input voltage occurs via the pre-charge circuit, such as amplifier 30 and switch A8, rather than requiring charge flow to or from the RC filter 13. It can be seen that the act of pre-charging has been split into two phases when switching from the conversion to acquire modes of operation so as to substantially ensure that none or substantially none of the charge injection that may result form turning on switch A1 is dissipated by the amplifier 30 but is instead wholly or substantially cancelled by turning off switch A2.

The precharge amplifier may be associated with one or more capacitors 105 of an analog to digital converter.

Preferably, the pre-charge amplifier is able to operate over the entirety of the valid input range for the analog to digital converter. This is easy to achieve if the rail voltages for the pre-charge circuit exceed the signal input voltages for the analog to digital converter by a sufficient margin to ensure that none of the devices within the pre-charge circuit suffer from any voltage head room problems. However in low power battery operated circuits it is possible that the pre-charge circuit will be run from a relatively low supply, which may be lower than part of the input span of the ADC. In this case voltage translation means may be provided.

Figure 8:
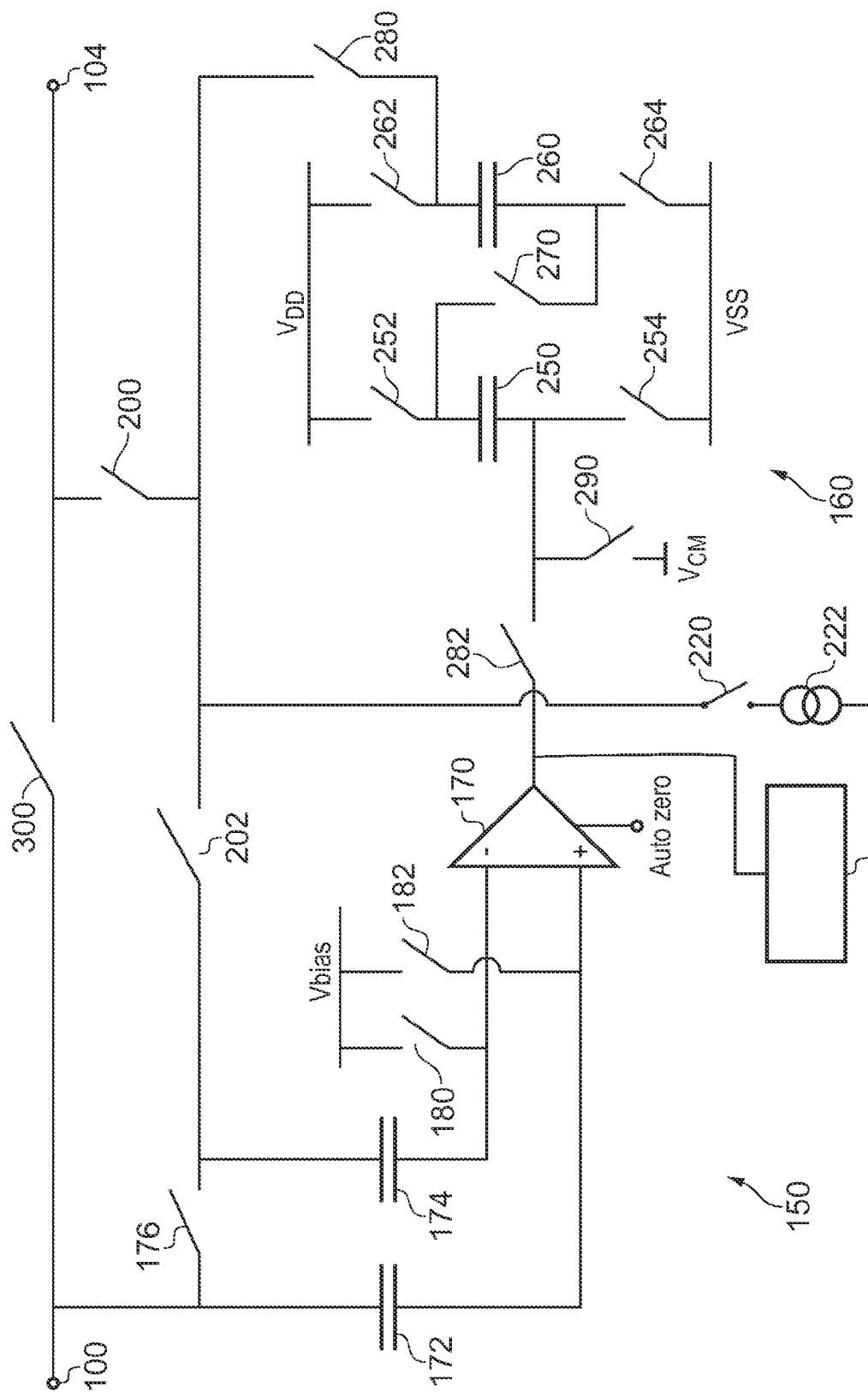
FIG. 8 is a schematic diagram of an embodiment of a pre-charge circuit.

FIG. 8 schematically illustrates a pre-charge circuit comprising an amplifier generally designated 150 in association with a voltage translation circuit, generally designated 160.

The amplifier circuit 150 comprises an operational amplifier 170 having a non-inverting input connected, in this example, to the input node 100 via a capacitor 172. An inverting input of the amplifier 170 receives its input by way of a capacitor 174. A first switch 176 is operable to connect the uppermost plates of the capacitors 172 and 174 (as shown in FIG. 8) together. Second and third switches 180 and 182 are operable to connect the inverting and non-inverting inputs of the amplifier 170 to a common voltage Vbias, such as VDD (where the amplifier can easily accept input voltages in excess of its positive supply rail) or $$\frac{VDD}{2}$$

where it is desired to place the input voltages at the centre of the operating voltage range of the amplifier 170. During an input acquiring phase, which can occur once the input has been selected for provision to the analog to digital converter of FIG. 2, but ideally before the end of conversion occurs, switches 176, 180 and 182 can be closed. The voltage difference between the input at node 100 and the voltage Vbias is then acquired on each of the capacitors 172 and 174. The amplifier may also be instructed to perform an auto-zero operation at this time. After a sufficient settling time the switches 176, 180 and 182 are opened again. The amplifier is now ready for use in order to act as a pre-charge circuit or pre-charge buffer. During the pre-charge phase switches 200 and 202 are closed so as to connect the voltage at the sample or output node 104 (which is at the voltage that will be sampled by the analog to digital converter) to the inverting input of the amplifier 170 via the capacitor 174. The amplifier 170 now acts as a comparator to indicate whether the voltage at node 104 is greater than or less than the voltage at the input node 100. If the voltage at node 104 is greater than that at node 100, then a switch controller 210 responsive to the output of the amplifier 170 closes a switch 220 to allow current to flow from node 104 to ground by way of a current sink 222. This occurs until such time as the voltages become substantially equal or the voltage at node 104 just dips below that at voltage at the node 100 and then the controller 210 opens switch 220 so as to stop the current flow. If the voltage at the node 104 is less than that at the node 100, then the output of the amplifier 170 may be provided to node 104 via the voltage translation circuit 160 thereby ensuring that the voltage output by the voltage translation circuit can exceed the relatively low VDD used to drive the amplifier. The voltage translation circuit may include one or more capacitors, in this example two are shown, which can be charged to deliver an enhanced voltage to the node 104. The correction may be performed in two steps.

As shown in FIG. 8, the voltage translator 160 comprises a first voltage translation capacitor 250 having its uppermost plate connected to VDD by way of a high side switch 252 and its lowermost plate connected to VSS connected to a low side switch 254. The terminology high side and low side used herein refers to the position of the switches in relation to the capacitors as shown in FIG. 8. Similarly a second voltage translation capacitor 260 is connected to VDD via a high side switch 262 and to VSS via a low side switch 264. An intermediate switch 270 is provided so as to be able to selectively connect the upper plate of the first voltage translation capacitor 250 to the lower plate of the second voltage translation capacitor 260. An output switch 280 is provided so as to be able to connect the upper plate of the capacitor 260 to node 104 via switch 200.

As a first part of the charging process capacitors 250 and 260 may be operated as a charge pump in order to lift the voltage at node 104 to greater than or approximately equal to that at node 100. In order to do this the charge pump operates in a charging phase in which switches 252, 254, 262 and 264 are closed, whereas switches 270 and 280 are open. This causes each of the voltage translation capacitors 250 and 260 to be charged to VDD. Then switches 252, 254, 262 and 264 are opened, and switch 290 is closed so as to connect the bottom plate of the first capacitor 250 to the common mode voltage Vcm (or to VDD). The switch 270 is closed so as to place the capacitors 250 and 260 in series such that the voltage at the uppermost plate of the second capacitor 60 becomes Vcm+2VDD. Switch 280 is then closed so as to move charge towards node 104 and on to the capacitors of the analog to digital converter. If the voltage as detected by the amplifier 170 at node 104 has still not exceeded that at node 100 then the charge pump is returned to its original condition and it can be used to perform a further round of charge pumping. If the voltage at node 104 has not exceeded that at node 100 then further rounds of charge pumping may be performed. If however the voltage at node 104 has exceeded that at node 100 then switch 290 is opened and a switch 282 may be closed so as to connect the output of the amplifier 170 to the bottom plate of the capacitor 250. Because the voltages at nodes 104 and 100 are quite close at this stage, the amplifier can perform a closed loop adjustment via the voltage translation properties of the voltage translation block 160 so as to substantially equalize the voltages at nodes 100 and 104. Once a time out period allocated to this function has expired then switch 200 is opened so as to disconnect the pre-charge circuit from the node 104. In this instance switch 200 corresponds to switch 32 of FIG. 2. Then a switch 300 is closed so as to connect nodes 100 and 104. Switch 300 has the same functionality as switch 24 of FIG. 2.

Figure 9:
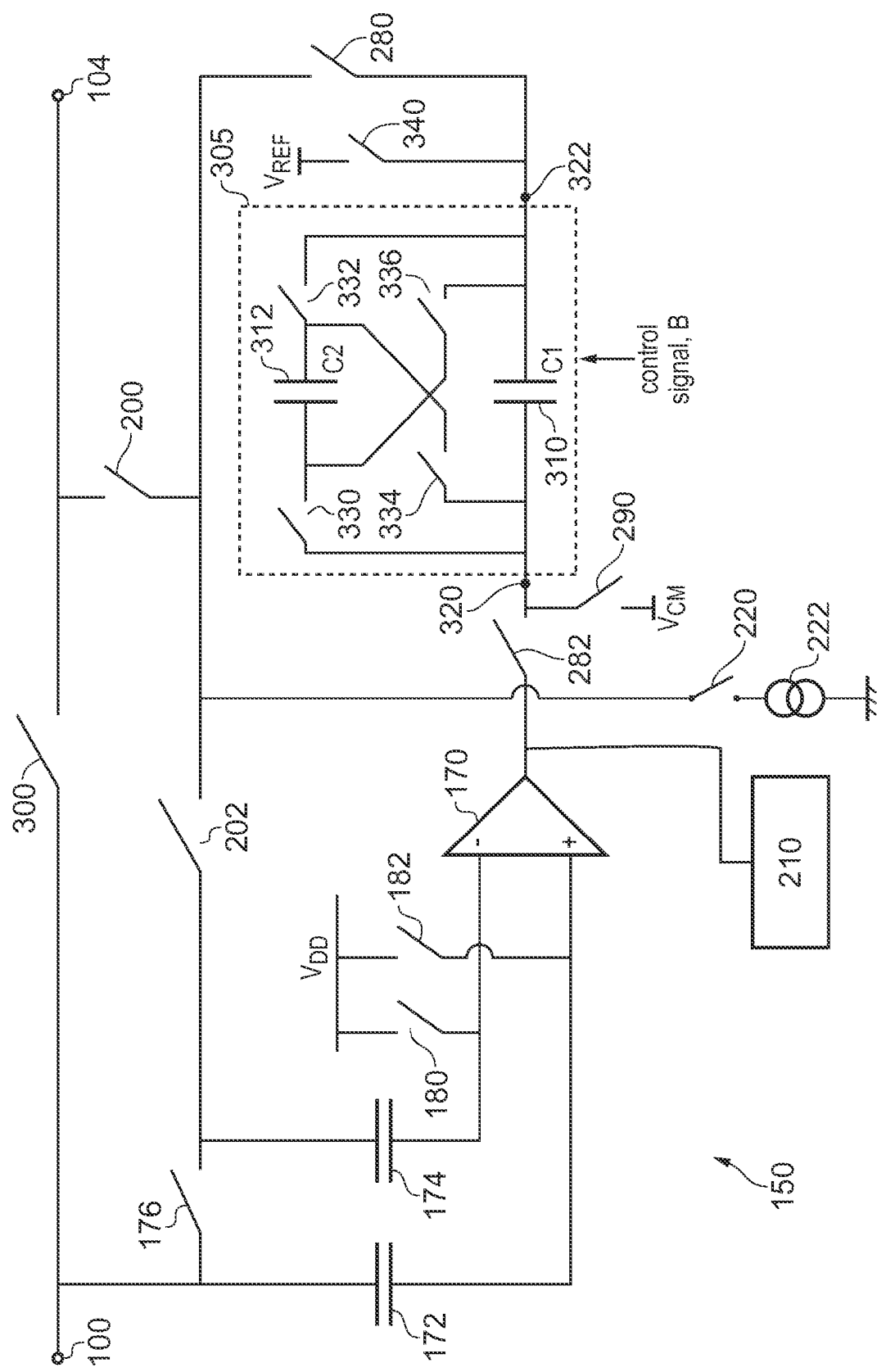
FIG. 9 shows a further embodiment of a precharge circuit including a voltage translation circuit.

FIG. 9 shows a further voltage translation network that may be used.

The voltage translation network 305 comprises a first voltage translation capacitor 310 having a capacitance C1 and a second voltage translation capacitor 312 having a capacitance C2.

The voltage translation network is formed between a voltage translation circuit input node 320 and a voltage translation circuit output node 322. The first capacitor 310 is, in this example, permanently connected between the input node 320 and the output node 322.

The second voltage translation capacitor 312 is associated with switches 330, 332, 334, 336. Switch 330 is operable to connect a first plate of capacitor 312 to the input node 320. Switch 332 is operable to connect a second plate of the capacitor 312 to the output node 322. Switch 334 is operable to connect the second plate of the capacitor 312 to the input node 320, and switch 336 is operable to connect the first plate of capacitor 312 to the output node 322.

The input node 320 can be connected to a common mode voltage $V_{cm}$ by switch 290, or to the output of the amplifier 170 by switch 282, as previously described with respect to FIG. 8.

The output node 322 can be connected to a further supply voltage, such as $V_{ref}$, by a further switch 340. The voltage translation circuit is also connected to switch 280 as previously described with respect to FIG. 8. Thus the voltage translation network 305 is a replacement for the charge pump 160 of FIG. 8.

During an initial phase of operation switch 340 is closed, with switch 280 is open. Switches 330 and 332 are closed, and switches 334 and 336 are open (high impedance). Switch 290 is closed and switch 282 is open. This has the consequence of connecting the right hand plates (as shown in FIG. 9) to $V_{ref}$ and the left hand places to $V_{cm}$. Thus the capacitors 310 and 312 are charged to $V_{ref}-V_{cm}$.

The switches 340 and 290 are then opened, leaving the capacitors charged to $V_{ref}-V_{cm}$.

The operation of the switches is now responsive to a control signal B, which may be a single signal or, as will be discussed later a single bit of a multibit word.

If, for example, B is high, switches 330 and 332 remain conducting, and switches 334 and 336 remain off. Thus the capacitors 310 and 312 remain connected in parallel. When switches 280 and 282 are closed the output of the amplifier is translated by the capacitors so as to add $V_{ref}-V_{cm}$ to it. Thus the amplifier can drive the node 104 to $V_{ref}$, even though the amplifier output range may be more limited, for example to a range centered about or topping out at substantially $V_{cm}$.

If the control bit B is low, then switches 330 and 332 turn off, and switches 334 and 336 turn on. Thus the polarity of the second capacitor 312 is reversed compared to that of the first capacitor and the capacitors redistribute charge between themselves until a new equilibrium voltage is reached.

The ratio of the capacitors can be selected to force the new equilibrium voltage V to substantially anywhere in the range $(V_{ref}-V_{cm})>V>-(V_{ref}-V_{cm})$.

If the capacitance ratio C2 to C1 is selected such that:

$$C2 = \frac{C1 \cdot V_{ref}}{V_{ref} - 2V_{cm}}$$

then the output at node 322 can be forced to 0V when the input node is at $V_{cm}$. This allows the sample node to be driven to 0V when the output of the amplifier is at $V_{cm}$.

Thus the output range required from the amplifier becomes reduced.

Figure 10:
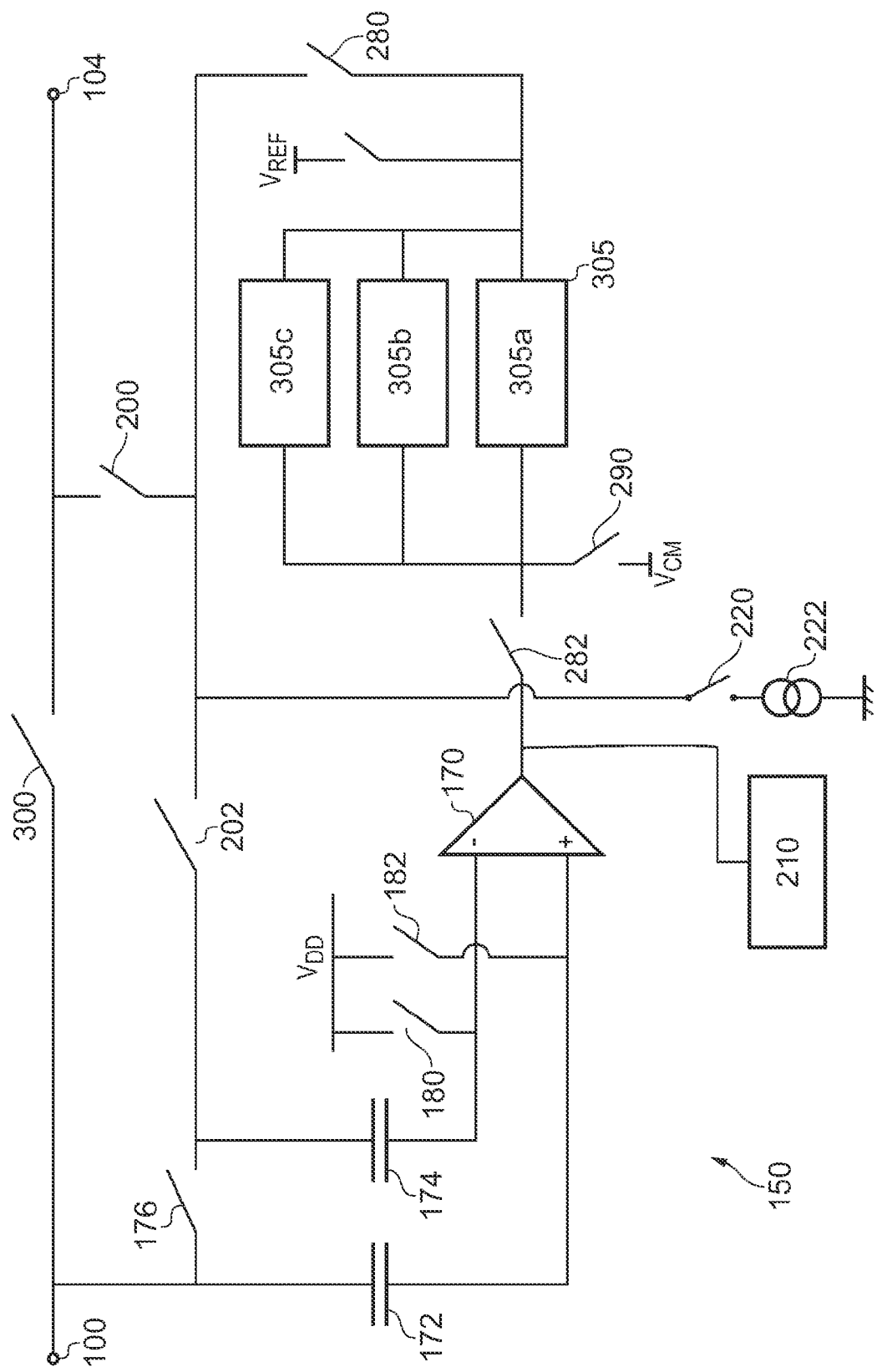
FIG. 10 illustrates a further embodiment of a precharge circuit.

The voltage translation circuit 305 of FIG. 9 can be reproduced several times within a circuit as shown in FIG. 10. Here three instances 305a, 305b and 305c of the circuit 305 are shown. The relative sizes of the capacitors can be scaled. Thus the capacitance of C1 in 305c may be twice that of capacitance C1 in 305b and four times that of capacitance C1 in 305a. Thus the blocks can be individually controlled to create a multibit DAC. This allows the operating range of the amplifier 30 to be further reduced provided that the voltage difference that it has to provide has been estimated, for example by a flash converter that measured the initial voltage difference at the inputs of the amplifier 170.

As noted with respect to FIG. 5, the action of A2 (when it is provided) is to switch in antiphase with switch A1 so as to substantially suppress voltage perturbations resulting from charge injection during switching of A1. The transistor (or possibly transistors) that form switch A1 needs to be large in order to give rise to a low on impedance to counteract the fact that $V_{GS}$ for switch A1 is not well defined because it depends on the voltage being sampled. Thus, A1 and A2, which have been shown as being single NMOS devices might be formed as parallel connected NMOS and PMOS devices with appropriate switch control signals. However, due to parasitic capacitances there by still be a small amount of charge injection from A1 that is not balanced by, and negated by, A2.

Figure 11:
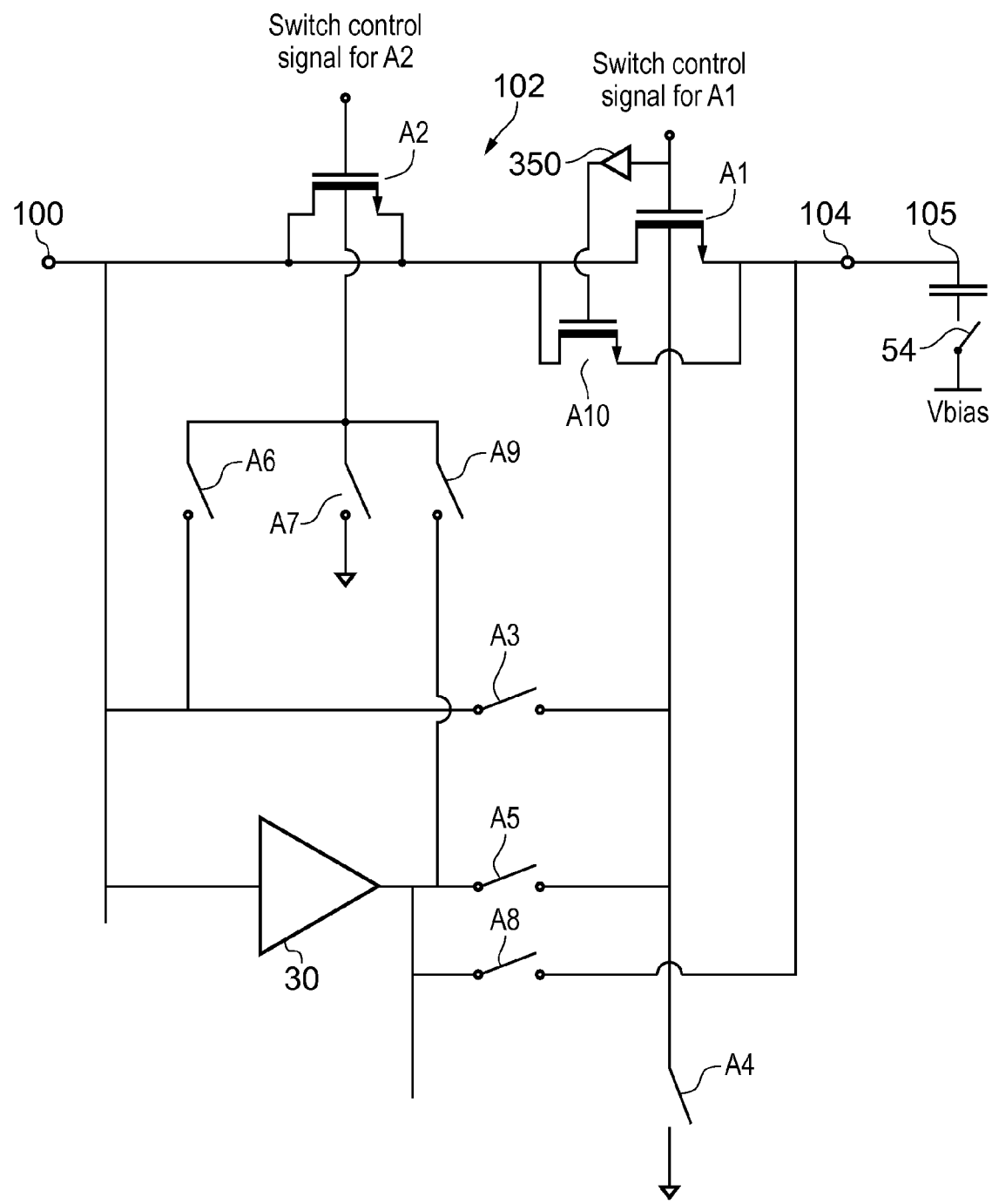
FIG. 11 illustrates a modified switch configuration.

FIG. 11 shows a modification to the circuit of FIG. 5 that further addresses the charge injection problem. As with FIG. 5, the sampling capacitor 105 of the ADC, whether it be instantiated as a single capacitor or as multiple capacitors possibly in a switched capacitor array, is selectively connectable to $V_{bias}$ by a switch 54, as was shown in FIG. 4. The source voltage of a FET forming switch 54 is well defined, and hence the gate-source voltage during a low impedance state of the transistor can be arranged so as to switch it to a low resistance state. Consequently the transistor implementing switch 54 can be made smaller than the transistor or transistors of switch A1 and A2. During the transition from acquire to convert, switch 54 transitions from a low impedance when charge is being sampled on to the sampling capacitor 105 to a high impedance in order to hold the sampled voltage on the sampling capacitor. Once switch 54 has become high impedance, the switch A1 is placed in a high impedance state. The charge that is injected by this flows mainly towards A2, as the direction towards the sampling capacitor is an open circuit. However, once parasitic capacitors are taken into consideration, a small amount of the charge may flow from the source of A1 to the parasitic capacitance. To obviate this, a small transistor A10 may be placed in parallel with A1. Transistor A10 may have a relatively high channel resistance compared to the transistor forming switch A1, but it is sufficient to allow the injected charge from the source of A1 dissipate. The transistor A10 can be driven by a slightly delayed version of the drive signal for A1, and may be delayed by merely a few nanoseconds by a delay element 350.

Figure 12:
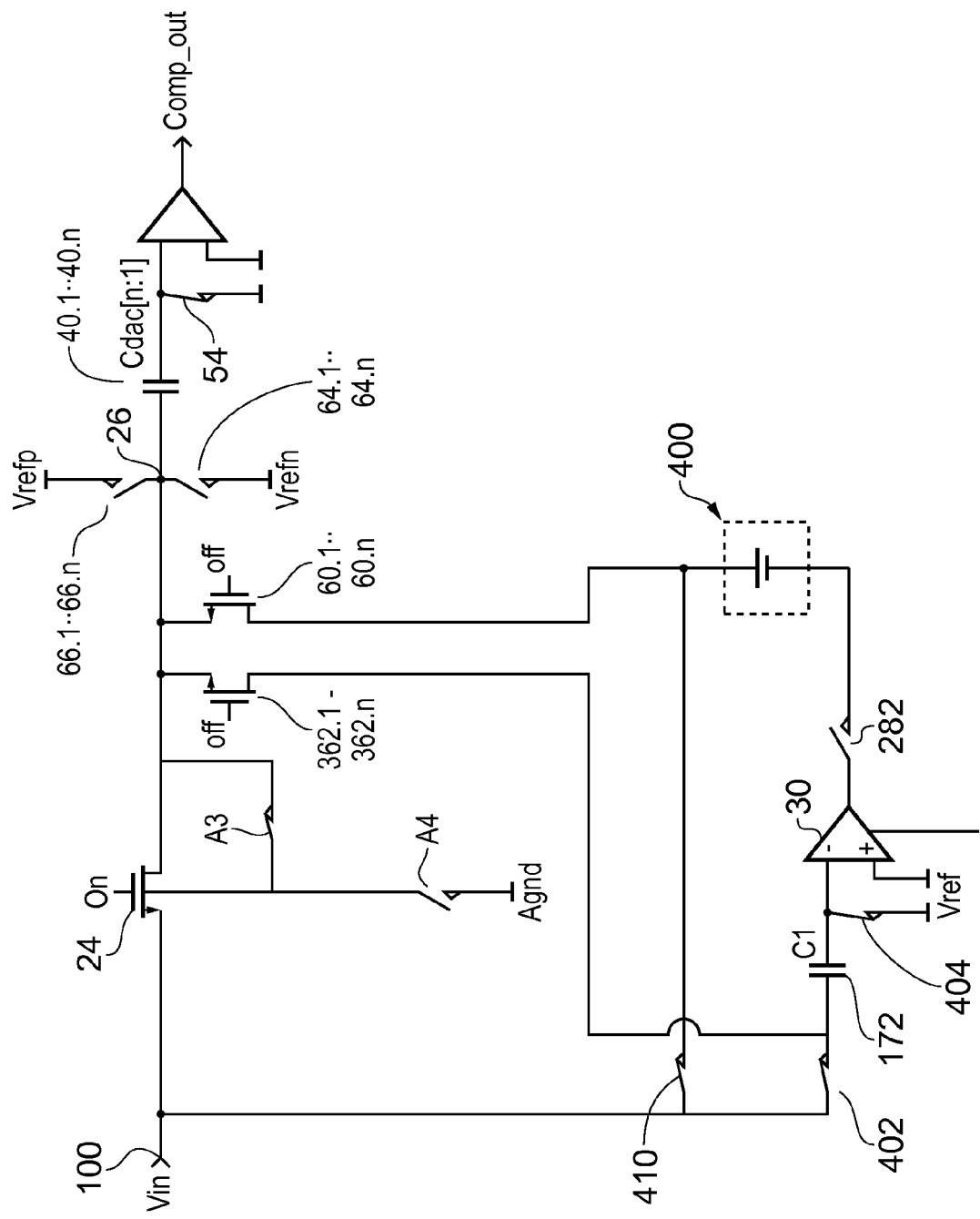
FIG. 12 is a circuit diagram of a further embodiment of an ADC associated with a precharge circuit in an initial phase.

FIG. 12 shows a further modified circuit, which is based on FIG. 2 but which shows the individual components in greater detail. The precharge amplifier 30 may be able to provide the desired voltage range required at the sampling node 26. Under such circumstances, then a voltage translation circuit, represented in FIG. 12 as a battery 400, is not required or can be bypassed. However if the amplifier 30 cannot provide the full voltage range required at the sampling node 26, then the voltage translation circuit 400 may be provided. The voltage translation circuit 400 is shown within a broken outline to illustrate that it is an optional circuit feature.

The arrangement of FIG. 12 also includes the circuit shown in FIG. 4. In FIG. 4 the individual sampling capacitors 40.1 to 40.N were shown as explicit and individual components, whereas in FIG. 12 they are represented by a single capacitor, but the labeling 40.1 to 40.N represents the multiple independent capacitors described herein with respect to FIG. 4. Similarly, the switches between the sampling node 26 (formed by the top plates of the individual capacitors that are used to sample the input voltage) and VrefP designated 66.1 to 66.N and shown explicitly in FIG. 4 are represented by a single switch in FIG. 12. Furthermore the individual switches between the sampling node 26 and VrefN shown in FIG. 4 as switches 64.1 to 64.4 are represented by a single switch in FIG. 12.

Referring back to FIG. 4, the output of the precharge circuit 30 was connectable to each of the individual capacitors 40.1 to 40.N via respective switches 60.1 to 60.N. The switches are also shown in FIG. 12, but for diagrammic simplicity are schematically illustrated as a single switch. To form a feedback loop, the input of the amplifier is connectable, by way of switches 362.1 to 362.N to the top plates of the capacitors 40.1 to 40.N. This connection is schematically represented by single switch.

Comparing FIG. 12 with FIG. 4, sampling switch 24 of FIG. 12 corresponds to the sampling switches 62.1 to 62.N.

The back gate of the or each sampling switch 24 (or 62) is connectable to the source of the or each sampling switch 24 by switch A3 which corresponds to a slight modification of the arrangement shown in FIG. 5. Similarly the back gate of the sampling switch 24 is also connectable to ground via switch A4, again corresponding to the arrangement shown in FIG. 5.

Comparing FIG. 12 with FIG. 9, the circuit configuration around the amplifier 30 and the voltage translation circuit 400 is similar to that shown in FIG. 9. Thus the amplifier 30 has an inverting input connected to a first plate of the capacitor 172, a second plate of the capacitor 172 is connectable to the input node 100 by way of a first precharge circuit sampling switch 402. The inverting input of the amplifier 30 and the first plate of the capacitor 172 are also connected to a reference voltage by way of a second precharge circuit sampling switch 404. The non-inverting input of the amplifier 30 is also connected to the reference voltage. An output of the amplifier 30 is connectable via an output switch 282 to a voltage translation circuit 400 which may correspond to the arrangement described hereinbefore with respect to FIG. 9 or 10. The output of the voltage translation circuit is selectively connectable to the input node 100 by a switch 410 which replicates the circuit paths shown in FIGS. 9 and 10 by virtue of switches 176, 202 and 280 all being set to a conducting state.

The circuit shown in FIG. 12 runs through several phases. In an initial phase, known as an acquisition phase, switch 24 is conducting, and the second sampling switch 54 is also conducting. Thus the voltage at the input node 100 is sampled on to the capacitors 40.1 to 40.N. The switches to VrefP and VrefN are in a non-conducting state. Similarly these switches 60.1 to 60.N from the amplifier, and optionally voltage translation circuit 400, are in a non-conducting state and switches 362.1 to 362.N are also non-conducting, so as to isolate the sampling node 26 from the amplifier input. Switch A3 is conducting (closed) and switch A4 is open.

Figure 13:
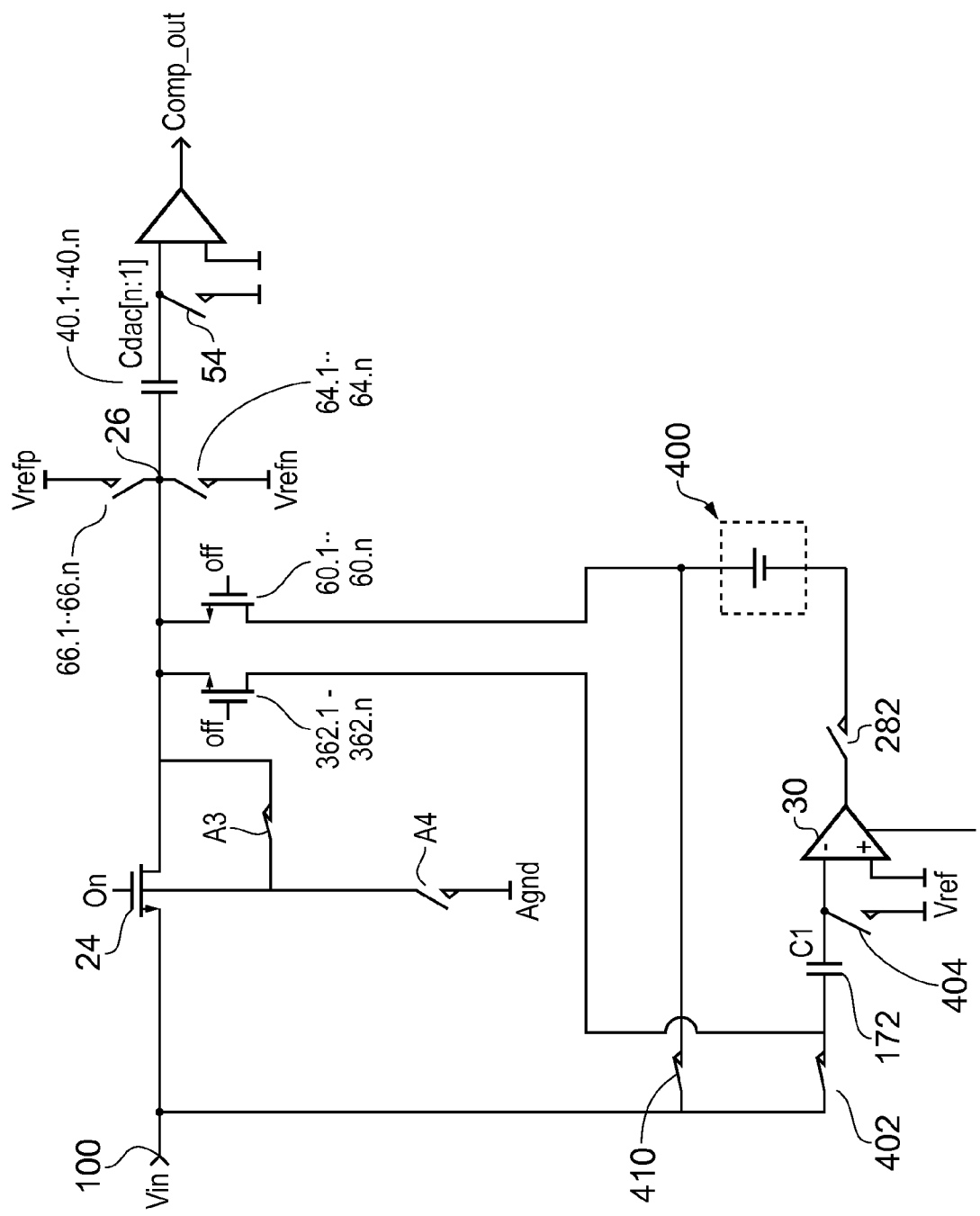
FIG. 13 shows the circuit of FIG. 12 in a sampling phase.

If we turn our attention to the circuit associated with the precharge amplifier, then the precharge circuit sampling switches 402 and 404 are also closed (conducting) so as to sample the input voltage on to the capacitor 172. The switch 410 is also closed, but the amplifier output switch 282 is open (high impedance). In order to sample the signal at the input node 100 onto the capacitors 40.1 to 40.N the sampling switch 54 is opened at an appropriate moment, and simultaneously or shortly after the sampling switch 404 associated with the precharge amplifier is also opened as shown in FIG. 13.

Figure 14:
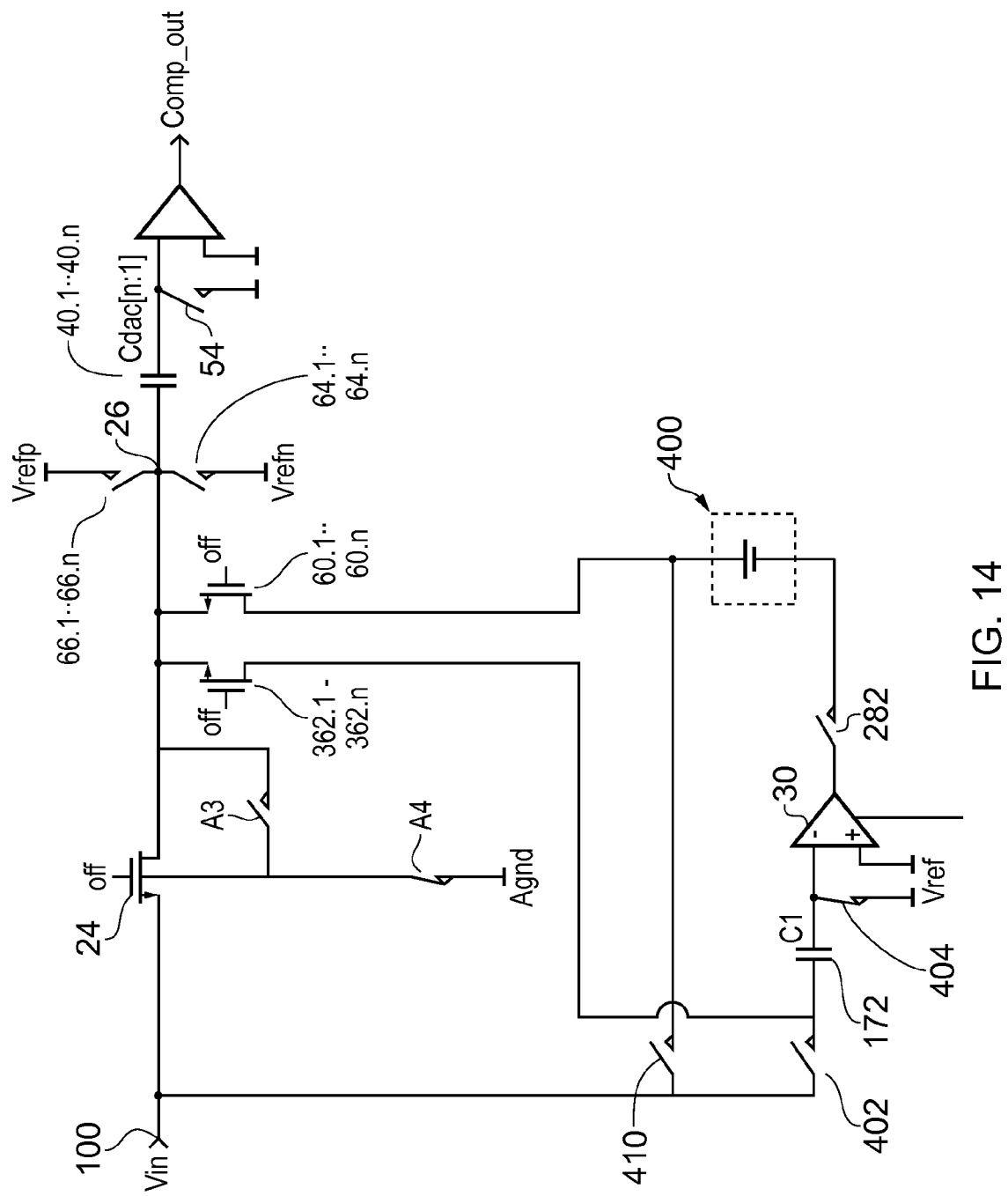
FIG. 14 shows the circuit of FIG. 12 in a pre-bit-trial phase.

The circuit then progresses to a pre-bit-trial phase, as shown in FIG. 14 in which the switches 402 and 410 are opened, and switch 24 is also opened, thereby placing these switches in a non-conducting state. Simultaneously with placing switch 24 in a non-conducing state, switch A3 is opened and switch A4 is closed so as to connect the back gate of switch 24 to ground.

The circuit may now run through the bit trail sequence where switches 64.1 to 64.N and 66.1 to 66.N are selectively driven within each bit trial to connect the top plate of their respective capacitors to one or other of the reference voltages in accordance with the known SAR bit trial sequence.

Figure 15:
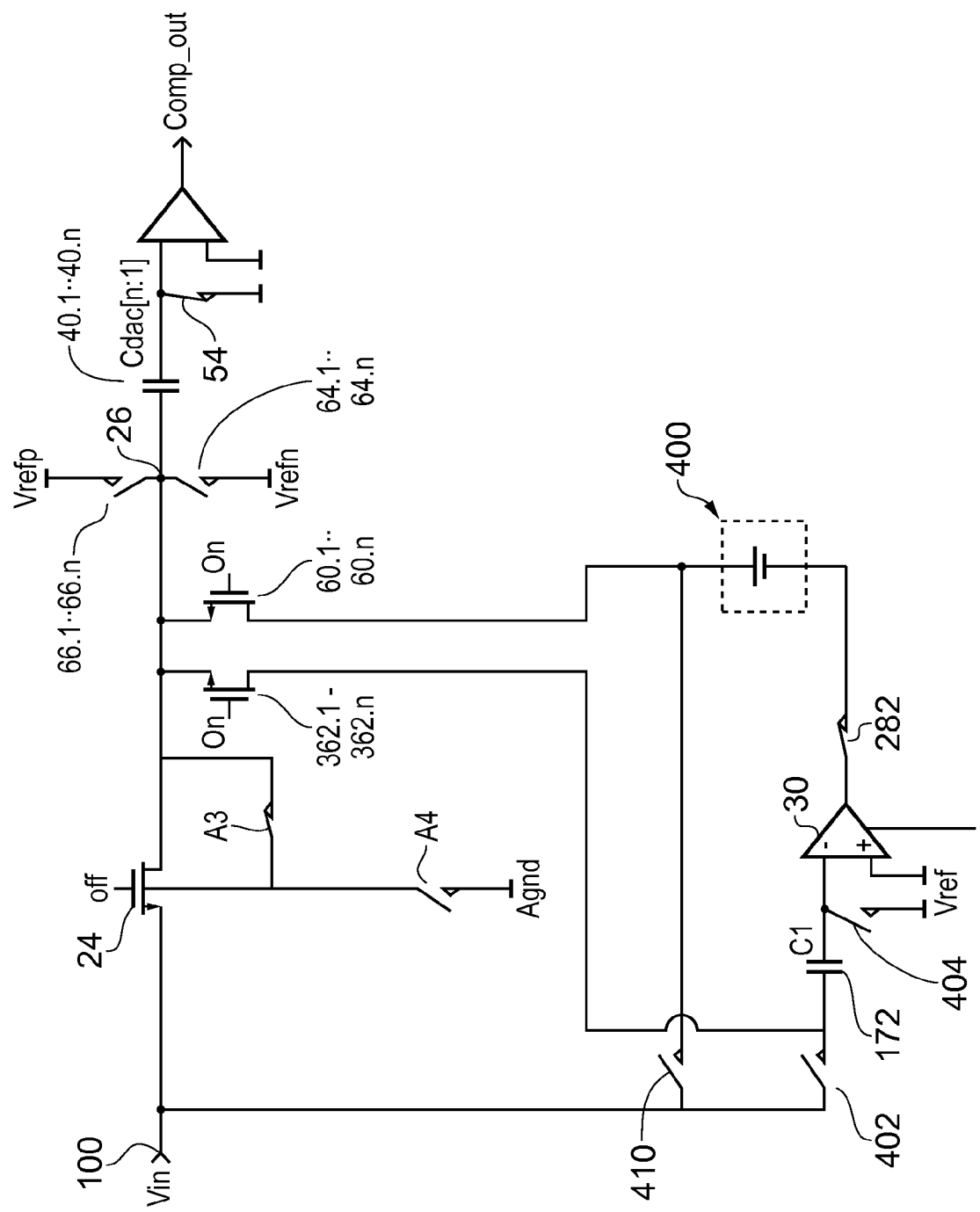
FIG. 15 shows the circuit of FIG. 12 in a precharge phase.

Once the SAR bit trial has been completed, the circuit then enters a precharge phase as shown in FIG. 15. In the precharge phase switch 54 normally is closed. Switches 64.1 to 64.N and 66.1 to 66.N are open (high impedance) and switch 24 remains in a high impedance state. Switch A4 is opened and switch A3 is closed such that the back gate of the switch 24 is now connected to the sampling node 26. The switch 282 at the output of the amplifier 30 is closed in order to connect the amplifier 30 to the voltage translation circuit 400. Switches 60.1 to 60.N and 362.1 to 362.N are placed in an on state such that the sampling node 26 is placed within a voltage following feedback loop around the amplifier 30 such that the voltage at the sampling node 26 is driven to correspond to the voltage sampled on to the capacitor 172 during the acquisition phase. Thus, in this arrangement, the sampling capacitors are returned to the voltage of the sample that has just been converted by the ADC. This approach is suitable for an analog to digital converter operating in a non-multiplexed manner. Where the analog to digital converter is implemented in switched capacitor SAR technology, as illustrated here, it might be assumed that, at the end of the SAR process, the voltage on the capacitors 40.1 to 40.N would equal the sampled voltage. This is generally true in a relatively simple SAR where no additional capacitors or modification of the switching regime is implemented within the array for correcting potentially incorrect bit decisions made during the SAR process or, in the case of differential comparators, where additional techniques are used to control the common mode voltage across the converter so as to run the comparator at its most favorable, and therefore accurate input voltage range. In the case of a segmented converter where only some of the capacitors are used for sampling, then again the voltage shared between them at the end of the conversion process may differ from the initially sampled voltage.

Following completion of the precharge phase the circuit transitions back to the acquisition configuration as hereinbefore described with respect to FIG. 13.

It is thus possible by use of a pre-charge circuit to reduce perturbations in the voltage at the output of an RC filter, or indeed other filter or driving circuit, provided at the input of an analog to digital converter. Furthermore, by appropriate design of a switching circuit located between the filter 13 and the analog to digital converter 20 it is possible to significantly reduce perturbations due to charge injection resulting from operation of the switches. Furthermore, it is also possible to provide a pre-charge circuit which can charge or discharge the capacitors of the analog to digital converter, even though the devices of the pre-charge circuit is run at a relatively low voltage compared to the input voltage range of the signal to be digitized.

The claims presented here are in single dependency format suitable for use at the USPTO. However for the avoidance of doubt relating to amendments of the claims any dependent claim may depend on any preceding dependent claim except where that is clearly not technically feasible.

The invention claimed is:

1. An analog to digital converter comprising at least one sampling capacitor connectable to an input node, and a pre-charge circuit arranged to cause a voltage at a sample node of the at least one sampling capacitor to substantially match an input voltage of the input node prior to the analog to digital converter entering an acquire mode in which the at least one sampling capacitor is connected to the input node by a first sample switch, wherein the pre-charge circuit comprises an amplifier and at least one of first and second inputs of the amplifier is connected, by at least one of a capacitor level shifting circuit and an attenuation circuit, to the sample node during an input acquire phase.

2. An analog to digital converter as claimed in claim 1, in which the pre-charge circuit is intermittently powered.

3. An analog to digital converter as claimed in claim 1, in which the pre-charge circuit is arranged to cause the voltage at the sample node of the at least one sampling capacitor to substantially attain a voltage of a preceding acquire mode.

4. An analog to digital converter as claimed in claim 1, in which the pre-charge circuit is arranged to cause the voltage at the sample node of the at least one sampling capacitor to substantially attain a voltage prevailing at the input node.

5. An analog to digital converter as claimed in claim 1, comprising a capacitor array, and in which the capacitor array can be connected in an acquisition configuration in which a plurality of the capacitors of the capacitor array are connected in parallel.

6. An analog to digital converter as claimed in claim 1, in which the amplifier is configured as a voltage follower.

7. An analog to digital converter as claimed in claim 1, in which the pre-charge circuit is de-powered during at least part of the acquire mode.

8. An analog to digital converter as claimed in claim 7, in which the powering up and powering down of the pre-charge circuit is controlled by a controller.

9. An analog to digital converter as claimed in claim 1, in which the analog to digital converter comprises or is a successive approximation routine analog to digital converter, and upon completion of a conversion a pre-charge circuit output switch is operated so as to connect the pre-charge circuit to the at least one sampling capacitor of the analog to digital converter.

10. An analog to digital converter as claimed in claim 9, in which after a predetermined period of time or when a determination circuit determines that the voltage at the sample node of the at least one sampling capacitor differs from the input voltage by less than a first threshold the pre-charge circuit is disconnected from the at least one sampling capacitor or an output of the pre-charge circuit is placed in a high impedance state, and the first sampling switch is placed in a low impedance state so as to connect the sample node to the input node.

11. An analog to digital converter as claimed in claim 10, in which the pre-charge circuit is de-powered within a second predetermined period following disconnecting the pre-charge circuit from the at least one sampling capacitor or placing the pre-charge circuit output in a high impedance state.

12. An analog to digital converter as claimed in claim 1, in which the first sample switch is a field effect transistor formed in an isolated well, and a switch control signal is applied to a gate of the field effect transistor and a voltage representative of the input voltage can be selectively supplied to a back gate of the field effect transistor.

13. An analog to digital converter as claimed in claim 12, further comprising an acquire switch connected to the sample switch and with at least the gate or back gate driven in antiphase with that of the sample switch.

14. An analog to digital converter as claimed in claim 13, in which a magnitude of a voltage swing on the back gate of the acquire switch is similar to that on the back gate of the sample switch.

15. An analog to digital converter as claimed in claim 13 whereby the back gate of the acquire switch is pre-charged to the input voltage, or to a previously sampled version of the input voltage.

16. An analog to digital converter as claimed in claim 1, in which the pre-charge circuit further includes a voltage translation circuit connected to an output of the amplifier.

17. An analog to digital converter as claimed in claim 16, in which the voltage translation circuit comprises at least one pair of charged capacitors switchable such that a polarity of one of the capacitors can be reversed with respect to the other in response to a control signal.

18. An analog to digital converter as claimed in claim 17, in which a plurality of translation circuits, having capacitors of the same or different values, are provided in parallel, to provide a digitally controllable voltage translation.

19. An analog to digital converter as claimed in claim 16, in which the voltage translation circuit is further operable as a charge pump.

20. An analog to digital converter as claimed in claim 1, in which during pre-charge the at least one sampling capacitor is connected to the sample node.

21. An analog to digital converter as claimed in claim 20, in which during pre-charge a second terminal of the at least one sampling capacitor is connected to a supply rail, to a voltage reference or bias, or to an additional input, such that the at least one sampling capacitor becomes charged.

22. An analog to digital converter as claimed in claim 20, in which during pre-charge a second terminal of the at least one sampling capacitor is disconnected by a switch such that charge is not stored on the at least one sampling capacitor but charge is provided to parasitic capacitances associated with transistor switches in a signal path of the at least one sampling capacitor.

23. An analog to digital converter as claimed in claim 1, further comprising a shorting transistor formed in parallel with the sample switch, and operable to provide a temporary conduction path following placing the sample switch in a high impedance state.

24. A switch arrangement for connecting a first node to a second node, comprising a first field effect transistor connected between the first node and the second node, and a second field effect transistor having a drain and source connected to the first node, and wherein control signals applied to gates of the first and second transistors are driven in antiphase, and further comprising means for selectively driving a back gate of the first field effect transistor to a bias voltage and to a buffered version of a voltage of the first node.

25. A switch arrangement as claimed in claim 24, further comprising means for selectively driving a back gate of the second field effect transistor to a bias voltage, to a voltage of the first node, or to a buffered version of the voltage of the first node.

26. A switch arrangement for connecting a first node to a second node, comprising a first field effect transistor connected between the first node and the second node, and a second field effect transistor having a drain and source connected to the first node, and wherein control signals applied to gates of the first and second transistors are driven in antiphase, and further comprising a shorting transistor in parallel with the first field effect transistor, and controlled so as to be conducting for a first time period after the first transistor has been made high impedance.

27. A switch arrangement as claimed in claim 26, further comprising means for selectively driving a back gate of the first field effect transistor to a bias voltage, to a voltage of the first node, or to a buffered version of the voltage of the first node.

28. A switch arrangement as claimed in claim 26, further comprising means for selectively driving a back gate of the second field effect transistor to a bias voltage, to a voltage of the first node, or to a buffered version of the voltage of the first node.

29. An analog to digital converter comprising:
at least one sampling capacitor connectable to an input node, and
a pre-charge circuit arranged to cause a voltage at a sample node of the at least one sampling capacitor to substantially match an input voltage of the input node prior to the analog to digital converter entering an acquire mode in which the at least one sampling capacitor is connected to the input node by a first sample switch, wherein the analog to digital converter comprises or is a successive approximation routine analog to digital converter, and upon completion of a conversion a pre-charge circuit output switch is operated so as to connect the pre-charge circuit to the at least one sampling capacitor of the analog to digital converter, and wherein after a predetermined period of time or when a determination circuit determines that the voltage at the sample node of the at least one sampling capacitor differs from the input voltage by less than a first threshold the pre-charge circuit is disconnected from the at least one sampling capacitor or an output of the pre-charge circuit is placed in a high impedance state, and the first sampling switch is placed in a low impedance state so as to connect the sample node to the input node.

30. An analog to digital converter as claimed in claim 29, in which the pre-charge circuit includes an amplifier, and at least one of first and second inputs of the amplifier is connected, either directly or by at least one of a capacitor level shifting circuit and an attenuation circuit, to the sample node during an input acquire phase.

31. An analog to digital converter as claimed in claim 29, in which the pre-charge circuit includes an amplifier, and at least one of first and second inputs of the amplifier is connected, either directly or via a capacitor level shifting circuit, to a reference voltage during an input acquire phase.

32. An analog to digital converter as claimed in claim 29, in which the pre-charge circuit includes an amplifier, and in which the pre-charge circuit further includes a voltage translation circuit connected to an output of the amplifier.

33. An analog to digital converter comprising:

at least one sampling capacitor connectable to an input node, and a pre-charge circuit arranged to cause a voltage at a sample node of the at least one sampling capacitor to substantially match an input voltage of the input node prior to the analog to digital converter entering an acquire mode in which the at least one sampling capacitor is connected to the input node by a first sample switch, wherein the pre-charge circuit includes an amplifier, and wherein the pre-charge circuit further includes a voltage translation circuit connected to an output of the amplifier.

34. An analog to digital converter as claimed in claim 33, in which the voltage translation circuit comprises at least one pair of charged capacitors switchable such that a polarity of one of the capacitors can be reversed with respect to the other in response to a control signal.

35. An analog to digital converter as claimed in claim 34, in which a plurality of translation circuits, having capacitors of the same or different values, are provided in parallel, to provide a digitally controllable voltage translation.

36. An analog to digital converter as claimed in claim 33, in which the voltage translation circuit is further operable as a charge pump.

37. An analog to digital converter comprising:

at least one sampling capacitor connectable to an input node, and a pre-charge circuit arranged to cause a voltage at a sample node of the at least one sampling capacitor to substantially match an input voltage of the input node prior to the analog to digital converter entering an acquire mode in which the at least one sampling capacitor is connected to the input node by a first sample switch and in which the pre-charge circuit is arranged to cause the voltage at the sample node of the at least one sampling capacitor to substantially attain a voltage of a preceding acquire mode.

38. An analog to digital converter as claimed in claim 37, wherein a capacitor sampling and level shifting circuit is associated with a sample switch of the pre-charge circuit such that the at least one sampling capacitor can sample a voltage that is a difference between the voltage at the input node and a reference voltage.

39. An analog to digital converter as claimed in claim 38, wherein the pre-charge circuit comprises an amplifier and one of first and second inputs of the amplifier is connected by the capacitor sampling and level shifting circuit to the sample node during an input acquire phase.

40. An analog to digital converter as claimed in claim 37, wherein:

the pre-charge circuit includes an amplifier, and the pre-charge circuit further includes a voltage translation circuit connected to an output of the amplifier.

41. An analog to digital converter as claimed in claim 40, in which the voltage translation circuit comprises at least one pair of charged capacitors switchable such that a polarity of one of the capacitors can be reversed with respect to the other in response to a control signal.

* * * * *